US008546066B2

(12) United States Patent
Irisawa et al.

(10) Patent No.: US 8,546,066 B2
(45) Date of Patent: Oct. 1, 2013

(54) METHOD FOR ELECTROCONDUCTIVE PATTERN FORMATION

(75) Inventors: Munetoshi Irisawa, Tokyo (JP); Yuji Toyoda, Tokyo (JP); Yasuo Kaneda, Tokyo (JP); Kunihiro Nakagawa, Tokyo (JP)

(73) Assignee: Mitsubishi Paper Mills Limited, Tokyo (JP)

( * ) Notice: Subject to any disclaimer, the term of this patent is extended or adjusted under 35 U.S.C. 154(b) by 334 days.

(21) Appl. No.: 12/865,259

(22) PCT Filed: Jan. 22, 2009

(86) PCT No.: PCT/JP2009/051401
§ 371 (c)(1),
(2), (4) Date: Jul. 29, 2010

(87) PCT Pub. No.: WO2009/096438
PCT Pub. Date: Aug. 6, 2009

(65) Prior Publication Data
US 2010/0330504 A1 Dec. 30, 2010

(30) Foreign Application Priority Data

Jan. 30, 2008 (JP) ................................. 2008-018995
Apr. 17, 2008 (JP) ................................. 2008-107372
Jun. 4, 2008 (JP) ................................. 2008-146770
Jun. 10, 2008 (JP) ................................. 2008-151218
Nov. 11, 2008 (JP) ................................. 2008-288335

(51) Int. Cl.
*G03F 7/20* (2006.01)
(52) U.S. Cl.
USPC ............................................................ 430/313
(58) Field of Classification Search
USPC .................... 430/311, 313, 318, 322, 323
See application file for complete search history.

(56) References Cited

U.S. PATENT DOCUMENTS

| 4,888,269 A | 12/1989 | Sato et al. | |
|---|---|---|---|
| 2005/0025946 A1 | 2/2005 | Sato et al. | |
| 2006/0063110 A1* | 3/2006 | Kiyoyama et al. | 430/302 |
| 2006/0269877 A1* | 11/2006 | Boyd et al. | 430/326 |
| 2008/0070167 A1* | 3/2008 | Takahashi et al. | 430/330 |

FOREIGN PATENT DOCUMENTS

| JP | 62-7774 | 1/1987 |
|---|---|---|
| JP | 2-133417 | 5/1990 |

(Continued)

OTHER PUBLICATIONS

International Search Report issued Apr. 28, 2009 in International (PCT) Application No. PCT/JP2009/051401 along with the Written Opinion.

*Primary Examiner* — Brittany Raymond
(74) *Attorney, Agent, or Firm* — Wenderoth, Lind & Ponack, L.L.P.

(57) ABSTRACT

A method for forming a conductor pattern comprising the steps of (a) forming a photo-crosslinkable resin layer on a substrate provided with a conductive layer on its surface, (b) treating the photo-crosslinkable resin layer with an alkali aqueous solution to render it thinner, (c) carrying out exposure for a circuit pattern, (d) developing and (e) etching, the steps included in this order, said alkali aqueous solution being an aqueous solution containing 5 to 20 mass % of an inorganic alkaline compound, or method for forming a conductor pattern comprising the steps of (a') forming a photo-crosslinkable resin layer on a substrate provide with a conductive layer on its surface and inside a hole thereof, (i) curing the photo-crosslinkable resin layer on the hole alone or on the hole and a surrounding area thereof, (b') treating the photo-crosslinkable resin layer in an uncured portion with an alkali aqueous solution to render it thinner, (c) carrying out exposure for a circuit pattern, (d) developing and (e) etching, these steps included in this order, said alkali aqueous solution being an aqueous solution containing 5 to 20 mass % of an inorganic alkaline compound.

18 Claims, 5 Drawing Sheets

(56) References Cited

FOREIGN PATENT DOCUMENTS

| JP | 05-273766 | * 10/1993 |
| JP | 5-273766 | 10/1993 |
| JP | 2004-214253 | 7/2004 |
| JP | 2004-246107 | 9/2004 |
| JP | 2005-136223 | 5/2005 |
| JP | 2005-208559 | 8/2005 |

* cited by examiner (b)

METHOD FOR ELECTROCONDUCTIVE PATTERN FORMATION

TECHNICAL FIELD

This invention relates to a method for forming a conductor pattern by a subtractive method.

BACKGROUND ART

As a method for producing a printed wiring board or a lead frame, there is a subtractive method in which an etching resist layer is formed in a circuit portion of an insulating substrate having a conductive layer formed thereon or a conductive substrate, and a conductive layer in an exposed non-circuit portion is removed by etching to form a conductor pattern. Further, there is also an additive method or semi-additive method in which a conductive layer is formed in a circuit portion of an insulating substrate by a plating method.

Meanwhile, with the downsizing and functional enhancement of electronic instruments in recent years, the density of printed wiring boards and lead frames for use inside instruments is increased, and their conductor pattern is decreased in size. At present, conductor patterns having a conductor width of 50 to less than 80 μm and an inter-conductor gap of 50 to 80 μm are produced by a subtractive method. Further, far higher densities and finer wirings have come to be employed, and there are demanded ultrafine conductor patterns having a conductor width or inter-conductor gap of less than 50 μm. Demands are accordingly intensified with regard to the accuracy of a conductor pattern and impedance. For forming such a fine conductor pattern, a semi-additive method has been conventionally studied as a substitute for the subtractive method, while it has a problem that the number of its production steps is greatly increased or a problem that the bonding strength of electrolytically plated copper is insufficient, etc. It has therefore become mainstream to produce printed wiring boards or lead frames by the subtractive method.

In the subtractive method, the etching resist layer is formed by a photofabrication method having the exposure development step using a photosensitive material, a screen printing method, an inkjet method, etc. Of these, a method using a sheet-shaped optically crosslinkable resin layer called a negative type dry film resist in the photofabrication method is suitably used since it is excellent in handling property and enables the protection of through holes by tenting.

In the method using an optically crosslinkable resin, an optically crosslinkable resin layer is formed on a substrate and the steps of exposure and development are carried out to form an etching resist layer. For forming a fine conductor pattern, it is necessary and indispensable to form a fine etching resist layer. For this purpose, the resist film needs to be decreased in thickness such that it is as thin as possible. When a dry film resist that is normally used as an optically crosslinkable resin layer is decreased in thickness such that it has a thickness, for example, of 10 μm or less, the inclusion of air bubbles having foreign particles as cores or the decrease of a concavoconvex form tracking property causes a problem that the resist layer peels or breaks, and it has been difficult to form a fine etching resist layer.

For overcoming the above problem, there has been proposed a method in which a dry film resist having a thickness of 25 μm or more is bonded to a substrate, the thickness of the dry film resist is then decreased to about 10 μm with an alkali aqueous solution, and then the exposure and development for a circuit pattern are carried out to form an etching resist layer (e.g., see JP 2004-214253A).

However, the method in the JP 2004-214253A has some problems. The first problem is that the formation of a thin film sometimes becomes non-uniform or that it is sometimes difficult to carry out the continuous formation of thinner films. As described in JP 2004-214253A, when the thickness of film of a dry film resist is decreased by the use of an alkali aqueous solution containing 1 mass % of sodium carbonate, the solubility speed of the dry film resist varies to a great extent due to differences of liquid flows in the substrate surface, it is hence difficult to form a uniformly thinner film from the dry film resist, and the in-plane width of a conductor formed by etching sometimes varies. Further, since a dissolved dry film resist is dissolved in the alkali aqueous solution, the dissolving capability of the alkali aqueous solution changes when continuous treatment is carried out, so that there is caused a problem that the continuous formation of thinner films can be no longer carried out.

The second problem is that when a printed wiring board having a through hole and non-through hole called a blind via hole (to be referred to as "hole" hereinafter) is made, a conductive layer inside the hole sometimes cannot be protected. In the subtractive method, the conductive layer formed inside the hole is protected by keeping an etching liquid from entering the hole according to a tenting method using a dry film resist. However, a dry film resist of which the thickness is decreased all over the surface as described in JP 2004-214253A has a problem that the conductive layer inside the hole is sometimes etched during the etching since the dry film resist tented over the hole breaks.

For overcoming the second problem, for example, there has been proposed a method for producing a circuit board, in which a dry film resist formed by stacking a first photosensitive resin layer and a second photosensitive resin layer which are different in sensitivity is used, a light quantity necessary for crosslinking the second photosensitive resin layer is applied in the form of a predetermined pattern, and a light quantity necessary for crosslinking both of the first photosensitive resin layer and the second photosensitive resin layer is applied over the hole and its surrounding area, thereby to form an etching resist layer having one thickness on a conductor-pattern-forming region and another thickness on the hole and its surrounding area on the surface of a conductive layer (e.g., see JP 2005-136223). However, the method described in JP 2005-0136223 requires a special dry film resist having two photosensitive resin layers different in sensitivity, and has a problem that it is difficult to adjust the alkali developability, application property, etc.

The third problem is an exposure-related problem. As an exposure method for a circuit pattern, there are known a reflected image exposure method using, as a light source, a xenon lamp, a high-pressure mercury lamp, a low-pressure mercury lamp, an ultra-high pressure mercury lamp or a UV fluorescent lamp, a one-surface or double-surface contact exposure method using an exposure mask, a proximity method, a projection method, a laser scanning exposure method, etc. In the laser scanning exposure method, the beam diameter of laser is large, and it is sometimes difficult to comply with a high resolution. Further, the laser scanning exposure method requires the use of use a special dry film resist having sensitivity to wavelengths inherent to a laser light source, it is not any generally practiced method. In the proximity method and the projection method, a space is there between an exposure mask and a dry film resist, and the resolution is sometimes decreased due to the diffracted light of exposure light, so that they are not any generally practiced methods, either. On the other hand, in the contact exposure method, the space between an exposure mask and a dry film resist is substantially zero, and when a light source of parallel rays is used, it can be said to be an exposure method that is the most suitable for a high resolution.

In JP 2004-214253, however, when an exposure for a circuit pattern is made according to a contact exposure method after a dry film resist is decreased in thickness, light reflected on a substrate surface is scattered (halation), which causes a problem that the resolution of a pattern is deteriorated. The adverse effect by the above halation on the substrate surface is negligibly small when the resist film has a large thickness, while it clearly appears when the resist film is an ultra-thin film having a thickness of 10 µm or less, and after a development step, it is difficult to resolve a narrow space having a size of 20 µm or less, a further improvement being required.

The fourth problem is also concerned with an exposure step. In JP 2004-214253, after a dry film resist is decreased in thickness, the surface of photo-crosslinkable resin layer of the dry film resist is exposed, so that the surface of the photo-crosslinkable resin layer is liable to have a hit mark or scratch due to a foreign matter when it is strongly intimately attached to an exposure mask in vacuum as it is. Further, since the photo-crosslinkable resin layer is in an exposed state, defects by the adherence of a foreign matter or scratches are liable to occur in a carrying step or inputting and receiving steps, etc. Further, when the surface of photo-crosslinkable resin layer of the dry film resist has tacking nature, the surface of the photo-crosslinkable resin layer and the surface of an exposure mask become poor in slipperiness when they are intimately attached to each other in vacuum, and a failure in the intimate attaching in vacuum takes place locally, so that a resist defect by the leak of light is liable to take place. Further, the photo-crosslinkable resin layer may be sometimes transferred to contaminate the exposure mask, or the resist layer may sometimes peel off, so that there is a problem that extra cleaning work is required.

SUMMARY OF THE INVENTION

Problems to be Solved by the Invention

It is an object of this invention to provide a method for forming a conductor pattern by a subtractive method in which a photo-crosslinkable resin layer is formed on a substrate provided with a conductive layer on its surface and the photo-crosslinkable resin layer is treated with an alkali aqueous solution to render it thinner, followed by treatments of exposure, development and etching for a circuit pattern, wherein the thickness of the photo-crosslinkable resin layer can be uniformly decreased and, further, the continuous treatment of layers to render them thinner can be stably carried out.

It is another object of this invention to provide a method for forming a conductor pattern, wherein the protection of a conductive layer inside a hole by tenting and the formation of a fine conductor pattern by the treatment to decrease the thickness of a layer can be accomplished together without requiring any special dry film resist.

It is further another object of this invention to provide a method for forming a conductor pattern, which is almost not susceptible to an adverse effect by halation even when the photo-crosslinkable resin layer after the treatment to decrease the thickness of a layer becomes an ultra-thin layer having a thickness of 10 µm or less.

And, it is still another object of this invention to provide a method for forming a conductor pattern, wherein the number of defects caused on the photo-crosslinkable resin layer by foreign matters or scratches in the carrying step and inputting and receiving steps is very small, the contamination of an exposure mask by a photo-crosslinkable resin and the separation of a resist layer during exposure under intimate contact do not take place, and further, the resist defect of light leak by a failure in intimate contact under vacuum does not take place.

Means to Solve the Problems

The present inventors have made diligent studies and as a result have found (1) a method for forming a conductor pattern by a subtractive method, which comprises the steps of (a) forming a photo-crosslinkable resin layer on a substrate provided with a conductive layer on its surface, (b) treating the photo-crosslinkable resin layer with an alkali aqueous solution to render it thinner, (c) carrying out exposure for a circuit pattern, (d) developing and (e) etching, the steps included in this order, said alkali aqueous solution being an aqueous solution containing 5 to 20 mass % of an inorganic alkaline compound, (2) a method for forming a conductor pattern by a subtractive method, which comprises the steps of (a') forming a photo-crosslinkable resin layer on a substrate provide with a conductive layer on its surface and inside a hole thereof, (i) curing the photo-crosslinkable resin layer on the hole alone or on the hole and a surrounding area thereof, (b') treating the photo-crosslinkable resin layer in an uncured portion with an alkali aqueous solution to render it thinner, (c) carrying out exposure for a circuit pattern, (d) developing and (e) etching, these steps included in this order, said alkali aqueous solution being an aqueous solution containing 5 to 20 mass % of an inorganic alkaline compound, (3) a method for forming a conductor pattern as recited in the above (1) or (2), wherein the inorganic alkaline compound is at least one compound selected from alkali metal carbonate, alkali metal phosphate, alkali metal hydroxide and alkali metal silicate, (4) a method for forming a conductor pattern as recited in any one of the above (1) to (3), wherein the alkali aqueous solution further contains at least one selected from sulfate and sulfite, (5) a method for forming a conductor pattern as recited in the above (1) or (2), wherein the step of treating the photo-crosslinkable resin layer to render it thinner comprises the steps of (b1) carrying out the treatment with an alkali aqueous solution containing 5 to 20 mass % of at least one inorganic alkaline compound selected from alkali metal carbonate, alkali metal phosphate, alkali metal hydroxide and alkali metal silicate and further containing at least one selected from sulfate and sulfite, and (b2) carrying out the treatment with an aqueous solution containing at least one inorganic alkaline compound selected from alkali metal carbonate, alkali metal phosphate and alkali metal silicate and having a pH of 5 to 10, (6) a method for forming a conductor pattern as recited in the above (5), wherein the aqueous solution containing at least one inorganic alkaline compound selected from alkali metal carbonate, alkali metal phosphate and alkali metal silicate and having a pH of 5 to 10 in the (b2) is supplied at a flow rate of 0.030 to 1.0 L/minute per $cm^2$ of the photo-crosslinkable resin layer, (7) a method for forming a conductor pattern as recited in the above (1) or (2), wherein the photo-crosslinkable resin layer contains (A) a polymer containing a carboxyl group, (B) a photopolymerizable compound having at least one polymerizable ethylenically unsaturated group in a molecule, (C) a photopolymerization initiator and (D) a polymerization inhibitor, and the content of the component (D) based on the photo-crosslinkable resin layer is 0.01 to 0.3 mass %, (8) a method for forming a conductor pattern as recited in the above (7), wherein the content of the component (B) based on the photo-crosslinkable resin layer is 35 to 55 mass %, (9) a method for forming a conductor pattern as recited in the above (1), wherein the step of (f) stacking a transparent film on the photo-crosslinkable resin layer is intervened between the step (b) and the step (c), and the step of (g) removing the transparent film is intervened between the step (c) and the step (d), and

(10) a method for forming a conductor pattern as recited in the above (2), wherein the step of (f) stacking a transparent film on the photo-crosslinkable resin layer is intervened between the step (b') and the step (c), and the step of (g) removing the transparent film is intervened between the step (c) and the step (d).

Effects of the Invention

In the method (1) for forming a conductor pattern in this invention, a photo-crosslinkable resin layer is attached to a substrate provided with a conductive layer on its surface, and then the photo-crosslinkable resin layer is treated with an alkali aqueous solution containing 5 to 20 mass % of an inorganic alkaline compound to render it thinner until it has a desired thickness. When a thin photo-crosslinkable resin layer having a desired thickness is attached directly to a substrate without the treatment to render it thinner, there would be caused a problem that the concavoconvex form tracking property is defective or that a resist peels off, etc. In this invention, however, the property of concavoconvex form tracking and the property of intimate contact to a substrate are remarkably good since a thick photo-crosslinkable resin layer is attached, and these properties are not impaired even after the treatment to render the photo-crosslinkable resin layer thinner, so that there are produced effects that the problems of resist peeling, etc., do not easily take place. Further, a thicker photo-crosslinkable resin layer generally has an advantage of being easily produced.

The photo-crosslinkable resin layer contains a component (soluble component) soluble in an alkali aqueous solution such as a polymer containing a carboxyl group, etc., and a component (insoluble component) insoluble in an alkali aqueous solution such as a photopolymerizable unsaturated compound, a photopolymerization initiator, etc. When an alkali aqueous solution having a low concentration is used for the treatment to render the photo-crosslinkable resin layer thinner, there is formed micelles each having an insoluble component in a center and having around it an soluble component having a surface active agent function, and the micelles are dispersed in the alkali aqueous solution while they are in an emulsion state, whereby the photo-crosslinkable resin layer is rendered thinner. The micelles in the alkali aqueous solution move depending upon the pressure and flow of the treatment liquid, so that the micelles on the photo-crosslinkable resin layer are washed away by making a liquid flow with a spray, etc. Therefore, the dissolving the photo-crosslinkable resin layer easily proceeds where the treatment liquid flows well, and where the liquid poorly flows, micelles remain on the photo-crosslinkable resin layer and the dissolving of the photo-crosslinkable resin layer is slow. In the treatment to render the photo-crosslinkable resin layer thinner, therefore, non-uniformity occurs in the substrate surface.

In contrast, in the method (1) for forming a conductor pattern in this invention, the treatment to render the photo-crosslinkable resin layer thinner uses a highly concentrated alkali aqueous solution having an inorganic alkaline compound concentration of 5 to 20 mass %. In the highly concentrated alkali aqueous solution, micelles of the photo-crosslinkable resin layer component are once insolubilized, and they are not easily dissolved or dispersed in the alkali aqueous solution. Therefore, the micelles similarly remain on the photo-crosslinkable resin layer even where the treatment liquids flows well with a spray and where it poorly flows, and the dissolving of the photo-crosslinkable resin layer is slow, so that the photo-crosslinkable resin layer is rendered nearly uniformly thinner, which leads to an effect that the non-uniformity does not take place.

Further, when the treatment of the photo-crosslinkable resin layers to render them thinner is continuously carried out, a spray treatment apparatus of a horizontally carrying system is suitably used. When spray nozzles are arranged above and below, both surfaces of the substrate are continuously treated at the same time due to its horizontally carrying system, so that conductor patterns can be formed on both surfaces of the substrate. When the upper and lower surfaces are treated by a horizontally carrying system, the treatment liquid ejected by a spray is not easily eliminated from the treated upper surface, and treatment liquid stays on the treated substrate to bring about a nearly dipped state. On the other hand, on the lower surface treated, the treatment liquid ejected from the spray is readily eliminated, and the treatment surface of the substrate is constantly treated with the treatment liquid ejected from the spray. Therefore, the liquid flow on the upper surface treated and the liquid flow on the lower surface treated differ, which leads to the non-uniform formation of thinner layers. In the method (1) for forming a conductor pattern in this invention, however, nearly uniform treatment to render it thinner can be carried out on each of the upper and lower surfaces even if the liquid flows of the treatment liquid differ.

Further, when a highly concentrated alkali aqueous solution having an inorganic alkaline compound concentration of 5 to 20 mass % is used, micelles of the photo-crosslinkable resin layer are sparingly dispersible in the alkali aqueous solution, and remain in the photo-crosslinkable resin layer. And, when washed with water, the micelles are removed at once. That is, the photo-crosslinkable resin layer is not easily dissolved in the highly concentrated alkali aqueous solution, so that the dissolving capability of the alkali aqueous solution does not easily change, and that the continuous formation of thinner layers can be stably carried out.

In the method (2) for forming a conductor pattern in this invention, the photo-crosslinkable resin layer is formed on a substrate having a hole and having a conductive layer formed on its surface and inside the hole, then, the photo-crosslinkable resin layer on the hole alone or on the hole and its surrounding area is cured beforehand, and thereafter, the photo-crosslinkable resin layer in a non-cured portion is treated to render it thinner. In this manner, a thick etching resist layer having tenting strength can be formed on the hole alone or on the hole and its surrounding area, the tenting film does not easily break in the etching step, so that the conductive layer inside the hole is not easily etched. Further, in a portion that is not required for the tenting, the exposure and etching for a circuit pattern are carried out after the treatment to decrease the thickness of a layer, whereby a fine conductor pattern can be made. According to the above method (2), the protection of a conductive layer inside the hole by tenting and the formation of a fine conductor pattern by the treatment to decrease the thickness of a layer can be accomplished together without requiring any special dry film resist.

In the method (3) for forming a conductor pattern in this invention, the alkali aqueous solution contains, as an inorganic alkaline compound, at least one of alkali metal carbonate, alkali metal phosphate, alkali metal hydroxide and alkali metal silicate. In the photo-crosslinkable resin layer treated with these compounds, micelles that are once so insolubilized as not to be easily dissolved or diffused are well dispersed again, and the treatment to render it uniformly thinner can be carried out for a short period of time.

In the method (4) for forming a conductor pattern in this invention, the alkali aqueous solution further contains at least one of sulfate and sulfite. Accordingly, sulfate ion or sulfite ion causes hydration by salting out, the dissolving and diffusion of the micelles are more inhibited, and more uniform treatment to decrease the thickness of a layer can be accomplished.

In the method (5) for forming a conductor pattern in this invention, the treatment to render the photo-crosslinkable resin layer thinner comprises the steps of (b1) treating it with an alkali aqueous solution containing 5 to 20 mass % of at least one inorganic alkaline compound selected from alkali metal carbonate, alkali metal phosphate, alkali metal hydroxide and alkali metal silicate and further containing at least one of sulfate and sulfite, and (b2) treating it with an aqueous solution containing at least one inorganic alkaline compound selected from alkali metal carbonate, alkali metal phosphate and alkali metal silicate and having a pH of 5 to 10. In the step (b1), micelles of the photo-crosslinkable resin layer component are once insolubilized to inhibit the dissolving and diffusion of them, and in the step (b2), the micelles are re-dispersed and dissolved to be removed. When the step is separated into the step (b1) and the step (b2), almost no photo-crosslinkable resin layer is dissolved in the treatment liquid in the step (b1), so that the advantage is that the treatment liquid changes little in the dissolving capability and that the continuous treatment to decrease the thickness of layers can be stably carried out. In the step (b2), further, any one of carbonate, phosphate and silicate has excellent buffering capability in an alkali region, and therefore, even when part of the highly concentrated alkali aqueous solution from the step (b1) is included, a rapid pH increase can be prevented, and the pH change caused by the local non-uniform stirring and non-uniform spraying of the treatment liquid and the non-uniform dissolving of the photo-crosslinkable resin layer can be suppressed to the least degree. Further, when the aqueous solution having a pH of 5 to 10 is used, the re-dispersibility of the photo-crosslinkable resin layer component in (b2) can be maintained constant, and the treatment to render the layers thinner can be stably carried out.

In the method (6) for forming a conductor pattern in this invention, the aqueous solution containing at least one inorganic alkaline compound selected from alkali metal carbonate, alkali metal phosphate and alkali metal silicate and having a pH of 5 to 10 in the step (b2) is supplied at a flow rate of 0.030 to 1.0 L/minute per $cm^2$ of the photo-crosslinkable resin layer. When the flow rate for the supply in the step (b2) is insufficient, the re-dispersibility of the insolubilized photo-crosslinkable resin layer becomes poor, and its defective dissolving is liable to take place. As a result, a non-dissolved component is precipitated on the photo-crosslinkable resin layer that has been treated to render it thinner, and the tacking nature thereof may be sometimes a problem. In the method (6) for forming a conductor pattern in this invention, the flow rate for the supply is sufficiently large, and the insolubilized photo-crosslinkable resin layer component can be rapidly dispersed again, so that the in-plane nearly uniform treatment to decrease the thickness of a layer can be carried out without leaving a non-dissolved component on the photo-crosslinkable resin layer surface that has been treated to render it thinner.

In the method (7) for forming a conductor pattern in this invention, the photo-crosslinkable resin layer contains (A) a polymer containing a carboxyl group, (B) a photopolymerizable compound having at least one polymerizable ethylenically unsaturated group in a molecule, (C) a photopolymerization initiator and (D) a polymerization inhibitor, and the content of the component (D) based on the photo-crosslinkable resin layer is 0.01 to 0.3 mass %. FIG. 4 is a schematic cross-sectional view showing an exposure step for a circuit pattern. Exposure is applied to a photo-crosslinkable resin layer 1 formed on a substrate 2 through an exposure mask 3. An exposed portion of the photo-crosslinkable resin layer 1 constitutes a crosslinked portion 4, and a surrounding non-exposed portion around it undergoes photo-crosslinking by halation to form a semi-crosslinked portion 5.

FIG. 5 shows one example of the resist characteristic curve of a photo-crosslinkable resin layer. The X axis shows an exposure value ($mJ/cm^2$), and the Y axis shows a resist curing degree (%). In FIG. 5($a$), a photo-crosslinkable resin layer having the resist characteristic shown by a dotted line A starts photo-crosslinking at an exposure value $\alpha_A$. When the photo-crosslinkable resin layer is exposed at an exposure value of $\beta^1_A$ to $\beta^2_A$, it forms a semi-crosslinked region of which the photo-crosslinking is insufficient (halftone dot portion). The photo-crosslinking of the photo-crosslinkable resin layer exposed at an exposure value of $\alpha_A$ to $\beta^1_A$ is also insufficient, while it can be removed together with a non-exposed portion in a developing step since it has a low resist curing degree. The photo-crosslinkable resin layer in the present invention (7) contains, as essential components, (A) a polymer containing a carboxyl group, (B) a photopolymerizable compound having at least one polymerizable ethylenically unsaturated group in a molecule, (C) a photopolymerization initiator and (D) a polymerization inhibitor, and the component (D) is incorporated in an amount of 0.01 to 0.3 mass % based on the photo-crosslinkable resin layer. Due to the above component (D), the exposure value required to initiate the photo-crosslinking increases ($\alpha'_A$). As shown in FIG. 5($b$), therefore, generated radicals substantially do not participate in the crosslinking from the start of exposure to the exposure value of $\alpha'_A$, and a state where the resist curing degree is zero continues. And, after the exposure value exceeds $\alpha'_A$, the crosslinking starts to proceed. Therefore, a semi-crosslinked region is decreased in size, and a semi-crosslinked portion of a non-exposed portion is not easily generated, and it is hence thought that an etching resist pattern of high resolution can be materialized.

In the method (8) for forming a conductor pattern in this invention, the content of the component (B) based on the photo-crosslinkable resin layer is 35 to 55 mass %. FIG. 6 shows one example of resist characteristic curve of a photo-crosslinkable resin layer. The slope of the resist characteristic curve is called "γ value". The γ values of a dotted line A and a solid line B are $\tan \theta_A$ and $\tan \theta_B$, respectively, and they have a relationship of $\tan \theta_A < \tan \theta_B$. The semi-crosslinked region of the solid line B having a high γ value is narrower than the semi-crosslinked region of the dotted line A having a low γ value. When a photo-crosslinkable resin layer having a high γ value is used, an etching resist pattern of high resolution having less semi-crosslinked portion can be obtained. In this invention, it is thought that the γ value of the photo-crosslinkable resin layer is increased by adjusting the content of the component (B) based on the photo-crosslinkable resin layer to 35 to 55 mass %, and that, as a result, an etching resist pattern of high resolution can be materialized.

In the method (9) for forming a conductor pattern in this invention, the step of (f) stacking a transparent film on the photo-crosslinkable resin layer is intervened between the step (b) and the step (c) of the method (1) for forming a conductor pattern, and the step of (g) removing the transparent film is intervened between the step (c) and the step (d). When the photo-crosslinkable resin layer is in an exposed state after the treatment to render it thinner, the surface of the photo-crosslinkable resin layer is sometimes tacky, and after the transparent film is stacked thereon, it is brought in the state of being completely tackiness-free. The contamination of an exposure mask caused by the transfer of photo-crosslinkable resin layer therefore does not take place, either. Further, the defects of hit marks and scratches caused by a foreign matter can be suppressed as well, and even when an intimate contact exposure method advantageous for high resolution is used, the light leak resist defect caused by a failure in the intimate contact under vacuum does not take place.

In the method (10) for forming a conductor pattern in this invention, the step of (f) stacking a transparent film on the photo-crosslinkable resin layer is intervened between the step (b') and the step (c) of the step (2) for forming a conductor pattern, and the step of (g) removing the transparent film is intervened between the step (c) and the step (d). In this manner, a thick etching resist layer having tenting strength can be formed on the hole alone or on the hole and its surrounding area, and the photo-crosslinkable resin layer surface can be brought into the state of being completely tackiness-free, so that the contamination of an exposure mask caused by the transfer of photo-crosslinkable resin layer and the defects of hit marks and scratches caused by a foreign matter can be suppressed.

Figure 1:
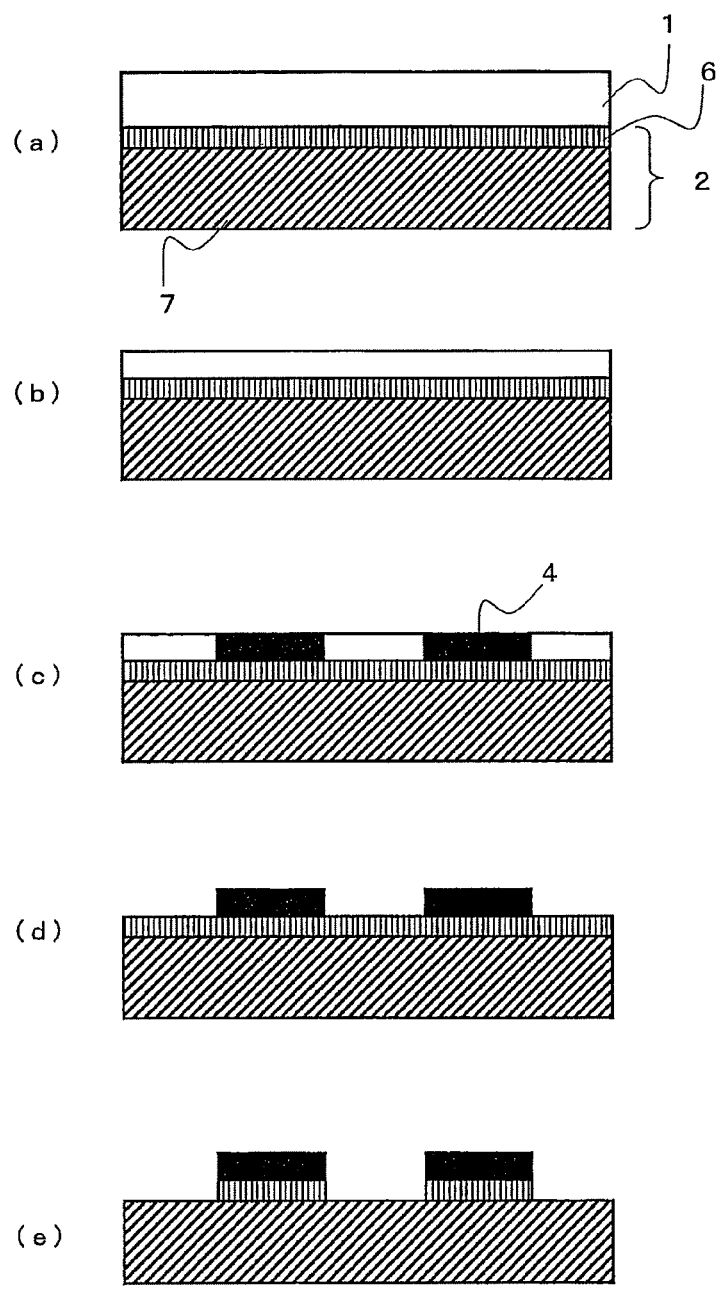
FIG. 1 shows process drawings of cross sections showing one example of the method (1) for forming a conductor pattern in this invention.

Reference numerals in FIGS. 1 to 4 will be explained below.

1 Photo-crosslinkable resin layer (non-crosslinked portion)
2 Substrate
3 Exposure mask
4 Crosslinked portion of photo-crosslinkable resin layer
5 Semi-crosslinked portion of photo-crosslinkable resin layer
6 Conductive layer
7 Insulating substrate
8 Hole

EMBODIMENTS FOR PRACTICING THE INVENTION

The method for forming a conductor pattern in this invention will be explained in detail hereinafter.

FIG. 1 shows process drawings of cross sections showing one example of the method (1) for forming a conductor pattern in this invention. As a substrate 2, an insulating substrate 7 having a conductive layer 6 formed on one surface is used. In step (a), a photo-crosslinkable resin layer 1 is formed on the conductive layer 6 of the substrate 2. In step (b), the photo-crosslinkable resin layer 1 is treated with an alkali aqueous solution to render it thinner. As the alkali aqueous solution, an aqueous solution containing 5 to 20 mass % of an inorganic alkaline compound is used. In step (c), the photo-crosslinkable resin layer 1 is exposed in a portion corresponding to a circuit pattern, to form a crosslinked portion 4. In step (d), the photo crosslinkable resin layer 1 (non-crosslinked portion) is removed by development. In step (e), the conductive layer 6 that is not covered with the crosslinked portion 4 of the photo-crosslinkable resin layer is etched to obtain a conductor pattern.

Figure 2:
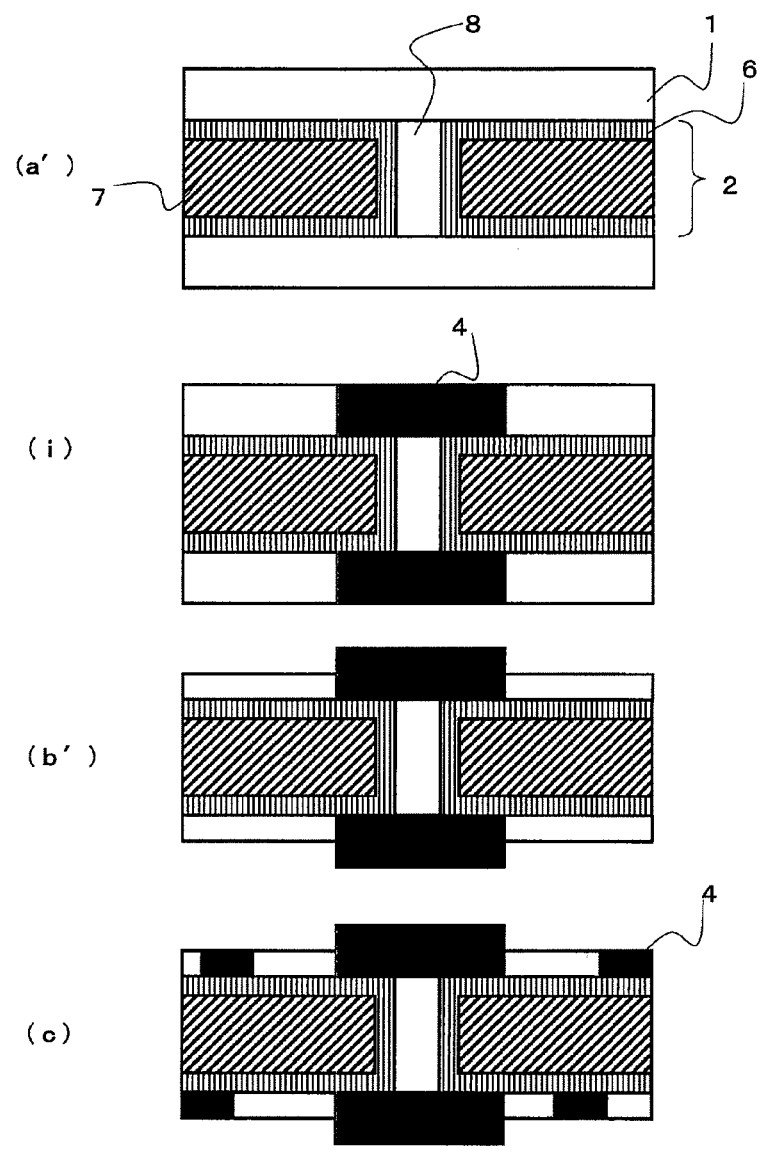
FIG. 2 shows process drawings of cross sections showing one example of the method (2) for forming a conductor pattern in this invention.
Figure 3:
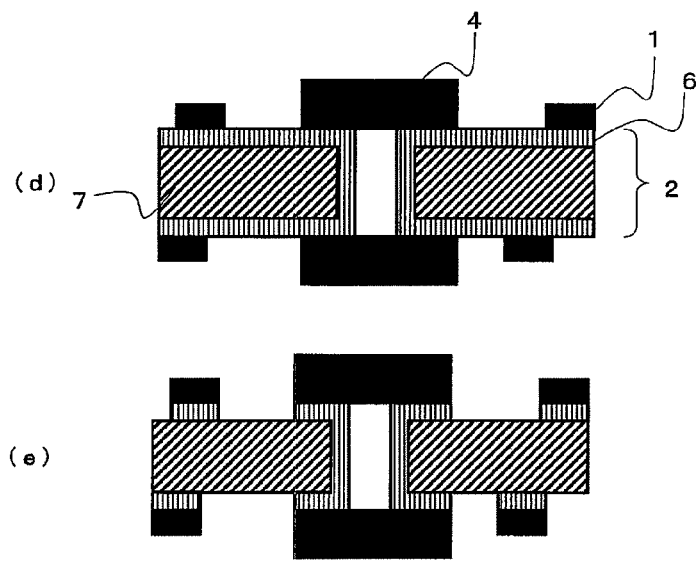
FIG. 3 shows process drawings of cross sections showing one example of the method (2) for forming a conductor pattern in this invention.
Figure 4:
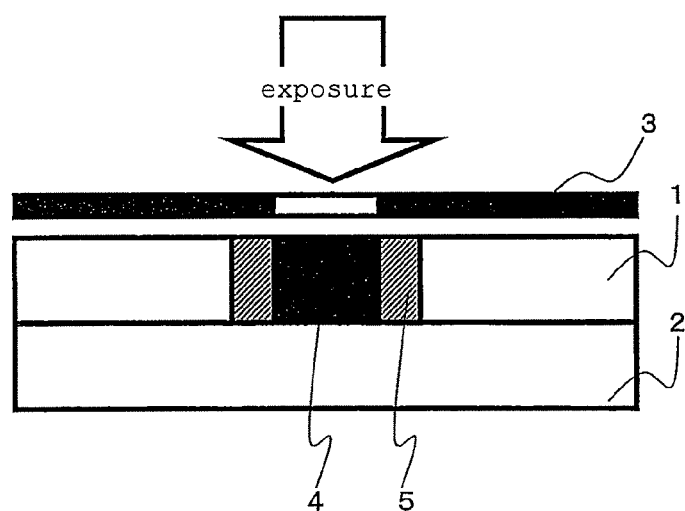
FIG. 4 is a schematic cross-sectional view showing an exposure step for a circuit pattern.
Figure 5:
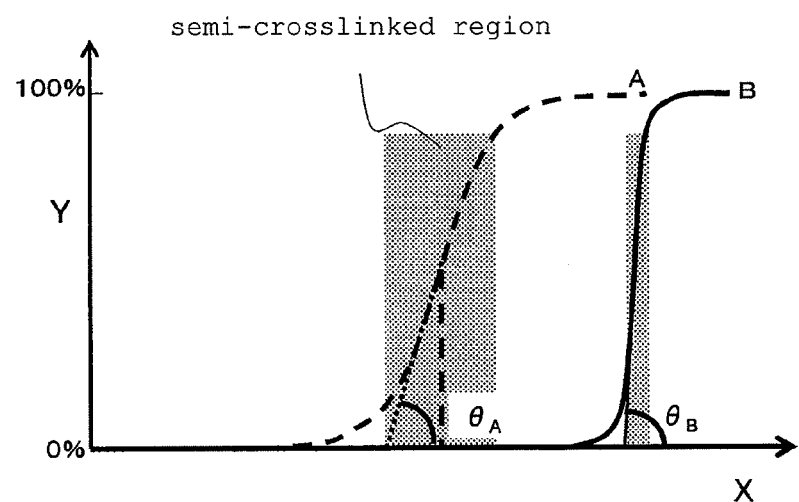
FIG. 5 shows one example of resist characteristic curve of a photo-crosslinkable resin layer.
Figure 5:
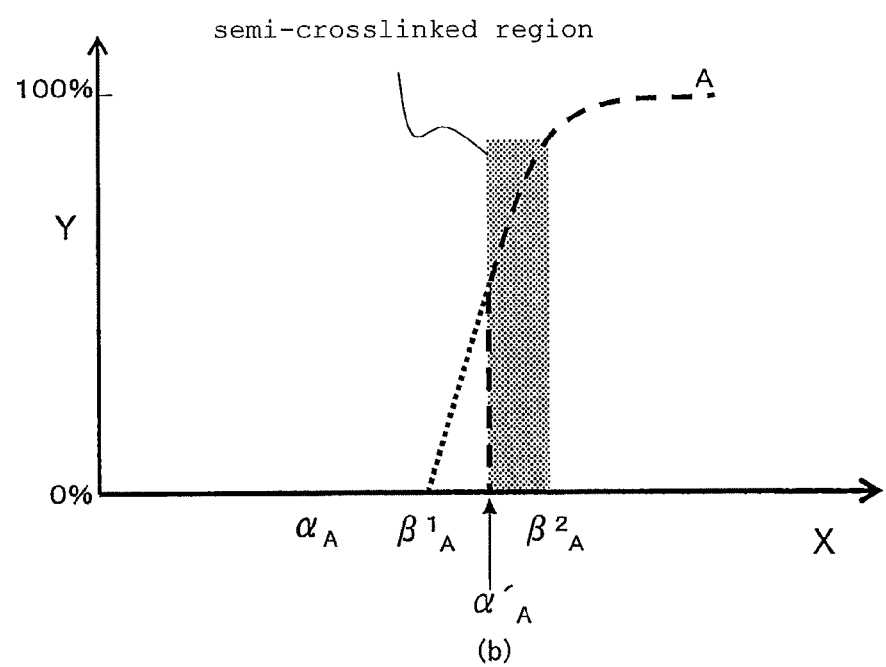
Figure 6:
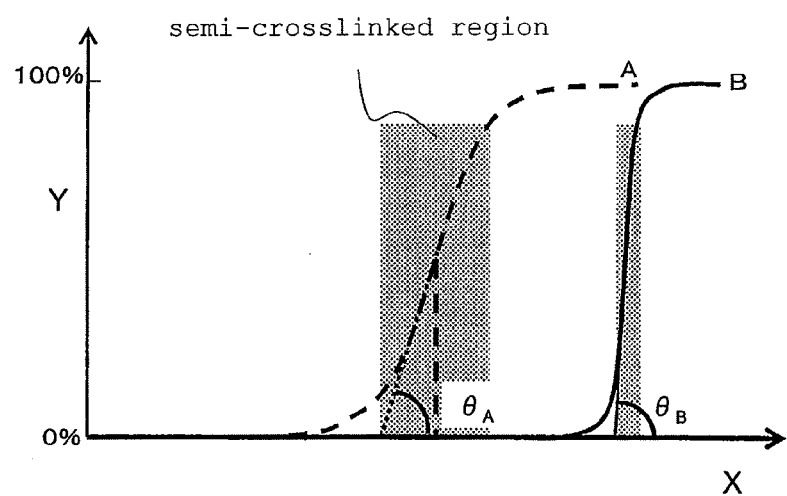
FIG. 6 shows one example of resist characteristic curve of a photo-crosslinkable resin layer.

FIGS. 2 and 3 shows process drawings of cross sections showing one example of the method (2) for forming a conductor pattern in this invention. As a substrate 2, an insulating substrate 7 having a hole 8 and having a conductive layer 6 formed on a surface and inside the hole is used. In step (a'), a photo-crosslinkable resin layer 1 is formed on the conductive layer 6 on the surface of the substrate 2 in a state where it closes the hole 8. In step (i), the photo-crosslinkable resin layer 1 on the hole 8 and its surrounding area is exposed to form a crosslinked portion 4. In step (b'), the photo-crosslinkable resin layer (non-crosslinked portion) is treated to render it thinner. In step (c), the photo-crosslinkable resin layer 1 corresponding to a circuit pattern is exposed to form a crosslinked portion 4. In step (d), the photo-crosslinkable resin layer (non-crosslinked portion) is removed by development. In step (e), the conductive layer 6 that is not covered with the crosslinked portion 4 of the photo-crosslinkable resin layer is etched to obtain a conductor pattern.

<Steps (a) and (a')>

In step (a), a photo-crosslinkable resin layer is formed on at least one surface of a substrate having a conductive layer formed on the surface. In step (a'), a photo-crosslinkable resin layer is formed on at least one surface of a substrate having a hole and having a conductive layer formed on the surface and inside the hole. The photo-crosslinkable resin layer can be formed, for example, with a laminator apparatus of a thermo-compression bonding system in which a rubber roll is heated and pressed on it. The heating temperature is preferably 100° C. or higher. The substrate may be subjected to pre-treatments such as alkaline cleaning, acid cleaning, etc.

The substrate having a conductive layer formed on its surface includes a printed wiring board and a substrate for a lead frame. The printed wiring board includes, for example, a flexible substrate and a rigid substrate. The insulating substrate of the flexible substrate has a thickness of 5 to 125 μm, and a 1 to 35 μm thick metal foil layer is formed on one surface or each surface thereof, and the flexible substrate has high flexibility. The material for the insulating substrate is generally selected from polyimide, polyamide, polyphenylene sulfide, polyethylene terephthalate, a crystalline polymer, etc. The material having a metal foil layer formed on an insulating substrate may be selected from those which are produced by any method such as a method in which a metal foil is bonded with an adhesive, a casting method in which a liquid of a resin that is an insulating substrate material is applied to a metal foil, a sputtering/plating method in which a metal foil layer is formed by an electrolytic plating method on a several nanometer thin conductor layer (seed layer) that is formed on a resin film as an insulating substrate by a sputtering or vapor deposition method, and a laminating method in which a metal foil is bonded by hot pressing. As the metal of the metal foil layer, any one of metals such as copper, aluminum, silver, nickel, chromium and alloys of these, etc., can be used, while copper is generally used.

The rigid substrate includes a substrate provided with a metal foil layer, obtained by immersing a paper base material or glass base material in an epoxy resin, a phenolic resin, etc., stacking such materials to form an insulating substrate, placing metal foil(s) as a conductive layer on one or each surface thereof and forming them into a laminate under heat and pressure. Further, the substrate also includes a sealed board for multiple layers, made by preparing an inner layer wiring pattern and stacking thereon a prepreg, a metal foil, etc., and a multilayered board having a through hole and a non-through hole. The substrate has a thickness of 60 μm to 3.2 mm, and its material and thickness are selected depending upon the form of an end use as a printed wiring board. The material for the metal foil layer includes copper, aluminum, silver, gold, etc., while copper is most generally used. Examples of these printed wiring boards are described in "Printed Circuit Gijutsu Binran" (compiled by Japan Electronics Packaging and Circuit Association, 1987, issued by Nikkan Kogyo Shimbun, Ltd.) and "Multilayer Printed Circuit Board Handbook" (compiled by J. A. Scarlett, 1992, issued by Kindai Kagaku sha Co., Ltd.). The substrate for a lead frame includes substrates of iron nickel alloy, a copper-containing alloy, etc.

The substrate having a hole and having a conductor layer formed on its surface and inside the hole is made, for example, by making a hole in/through a substrate formed of an insulating substrate and a metal foil layer formed on its surface with a drill or a laser and then forming a metal layer on the surface including the inner portion of the hole by plating treatment such as electroless plating, electrolytic plating, etc.

The photo-crosslinkable resin layer refers to a resin layer whose exposed portion gets crosslinked to be insolubilized in a developer, and as one for forming a circuit, a negative type dry film resist is generally used. Many commercially available dry film resists at least have a photo-crosslinkable resin layer and have a constitution in which the photo-crosslinkable resin layer is formed on a support layer film of a polyester, etc., and in some cases, the photo-crosslinkable resin layer is sandwiched with it and a protective film of polyethylene, etc., formed thereon. The commercially available dry film resist that can be used as the photo-crosslinkable resin layer in this invention includes, for example, Sunfort series (trade name, supplied by Asahi Kasei E-Materials), Photec series (trade name, supplied by Hitachi Chemical Co., Ltd.), Riston series (trade name, supplied by DMDF Co., Ltd.), ALPHO series (trade name, supplied by Nichigo-Morton Co., Ltd.), etc.

The thickness of the photo-crosslinkable resin layer is preferably 15 to 100 μm, more preferably 20 to 50 μm. When the above thickness is less than 15 μm, the resist sometimes peels off or breaks due to the inclusion of air bubbles having foreign particles as cores or a defective concavoconvex form tracking property. When it exceeds 100 μm, the amount of the resin layer to be removed by the treatment to render it thinner is large, and the treatment to render it thinner takes a long time, which sometimes leads to poor productivity. Further, it is sometimes difficult to keep a stable quality in the continuous treatment.

<Step (i)>

In the method (2) for forming a conductor pattern in this invention, the photo-crosslinkable resin layer on the hole alone or on the hole and its surrounding area is selectively exposed for curing the photo-crosslinkable resin layer on the hole alone or on the hole and its surrounding area in the step (i). The exposure of the surrounding area is not essential. Since, however, the tenting by the photo-crosslinkable resin layer sometimes cannot be implemented due to a positional deviation that takes place during the exposure, it is preferred to expose the area surrounding the hole as well. The size of the surrounding area is not specially limited, and it can be set as required depending upon a positional deviation during the exposure. The exposure method includes a reflection image exposure using, as a light source, a xenon lamp, a high-pressure mercury lamp, a low-pressure mercury lamp, an ultra-high pressure mercury lamp or a UV fluorescent lamp, a one surface or double-surface intimate contact exposure method using an exposure mask, a proximity method, a projection method, a laser scanning exposure method, etc.

<Step (b) and step (B')>

In the step (b) and step (b'), the photo-crosslinkable resin layer is treated with an alkaline aqueous solution to render it thinner. When a support layer film is provided on the photo-crosslinkable resin layer, it is peeled off before the treatment to render the photo-crosslinkable resin layer thinner is carried out. The treatment to render it thinner refers to a treatment to render the photo-crosslinkable resin layer uniformly thinner, and it specifically refers to a treatment to convert it into a thinner layer having a thickness 0.05 to 0.9 times the thickness it has had before the treatment.

The alkali aqueous solution contains 5 to 20 mass % of an inorganic alkaline compound. When its amount is less than 5 mass %, micelles are hard to insolubilize, and micelles solubilized during the dissolving-removal are dissolved and diffused, so that an in-plane non-uniformity takes place in the treatment to decrease the thickness of a layer. Further, when it exceeds 20 mass %, the inorganic alkaline compound is liable to be precipitated, which leads to poor stability of the solution with time and poor workability. The pH of the solution is adjusted to the range of 9 to 12. Further, small amounts of a surfactant, an anti-foaming agent, a solvent, etc., may be added as required.

The inorganic alkaline compound can be selected from an alkali metal carbonate such as carbonate or bicarbonate of lithium, sodium or potassium, an alkali metal phosphate such as phosphate of potassium or sodium, an alkali metal hydroxide such as a hydroxide of lithium, sodium or potassium, an alkali metal silicate such as silicate of potassium or sodium, and an alkali metal sulfite such as sulfite of potassium or sodium. Of these, as specified in the method (3) for forming a conductor pattern in this invention, it is preferred to incorporate at least one inorganic alkaline compound selected from the alkali metal carbonate, alkali metal phosphate, alkali metal hydroxide and alkali metal silicate. Of these, the alkali metal carbonate is particularly preferred from the viewpoint of the capability of dissolving the photo-crosslinkable resin layer, the buffering capability of maintaining a pH of the treatment liquid, the maintenance of an apparatus, etc.

Further, as specified in the method (4) for forming a conductor pattern in this invention, preferably, the alkali aqueous solution contains at least one of sulfate and sulfite. The sulfate and sulfite include alkali metal sulfates or sulfites of lithium, sodium, potassium, etc., and alkaline earth metal sulfates or sulfites of magnesium, calcium, etc. Of these, alkali metal sulfates or sulfites are particularly preferably used. Sulfate ion or sulfite ion contained in the sulfate or sulfite has a high salting-out effect. The hydration degree based on the salting-out effect increases, and the dissolving and diffusion of micelles are further intensely inhibited, which permits the treatment to form a nearly uniform thinner layer.

The content (molar concentration) of the sulfate and/or sulfite is preferably 0.05 to 1.0 mol/L. When it is less than 0.05 mol/L, the salting-out power is low and the hydration degree is small, so that there may be caused a difference in the dissolving and diffusion speed depending upon a liquid flow, which sometimes reduces the effect on the enhancement of the treatment to decrease the thickness of a layer. When it is 1.0 mol/L or more, the hydration takes place to excess, and the dissolving and diffusion of the micelles are inhibited, so that a failure in dissolving is sometimes liable to take place. As a result, a non-dissolved component is precipitated on the photo-crosslinkable resin layer surface after its treatment to render it thinner, which sometimes leads to the problem of tacking nature.

The method of treatment to decrease the thickness of a layer includes a dipping method, a paddle method, a spraying method, a brushing method, a scraping method, etc., and the spraying method is the most suitable from the viewpoint of the dissolving speed of the photo-crosslinkable resin layer. In the spraying method, the treatment conditions (temperature, time and spray pressure) are adjusted as required depending upon the dissolving speed of the photo-crosslinkable resin layer used. Specifically, the treatment temperature is preferably 10 to 50° C., more preferably 15 to 40° C., still more preferably 15 to 35° C. The spray pressure is preferably 0.01 to 0.5 MPa, more preferably 0.02 to 0.3 MPa.

As specified in the method (5) for forming a conductor pattern in this invention, each of the step (b) and the step (b') of treating the photo-crosslinkable resin layer to render it thinner is preferably carried out in at least two divided steps, the step (b1) and step (b2). First, in the step (b1), an excess of a highly concentrated alkali aqueous solution is supplied, whereby the photo-crosslinkable resin layer component that is rendered micelles during its dissolving is once insolubilized to keep the component from being dissolved and diffused in the treatment liquid. Then, in the step (b2), there is supplied an aqueous solution containing at least one inorganic alkaline compound selected from alkali metal carbonate, alkali metal phosphate and alkali metal silicate and having a pH of 5 to 10, whereby the photo-crosslinkable resin layer component insolubilized in the step (b1) is re-dispersed to be dissolved and removed. In the step (b2), when the aqueous solution has a pH of less than 5, the photo-crosslinkable resin component dissolved by the re-dispersing may aggregate to form an insoluble sludge, and the sludge may adhere to the surface of the photo-crosslinkable resin layer that has been rendered thinner. On the other hand, when the aqueous solution has a pH of over 10, undesirably, the dissolving and diffusion of the photo-crosslinkable resin layer are promoted, and in-plane non-uniformity of the layer thickness is liable to take place. Further, the treatment liquid in the step (b2) may be used after pH-adjusted with sulfuric acid, phosphoric acid, hydrochloric acid, etc.

As specified in the method (6) for forming a conductor pattern in this invention, the supply flow rate of the above aqueous solution having a pH of 5 to 10 per $cm^2$ of the photo-crosslinkable resin layer in the step (b2) is preferably 0.030 to 1.0 L/minute. It is more preferably 0.050 to 1.0 L/minute, still more preferably 0.10 to 1.0 L/minute. When the supply flow rate is in the above range, the photo-crosslinkable resin layer can be treated to render it thinner uniformly within its plane without leaving a non-dissolved component on the so-treated photo-crosslinkable resin layer. When the supply flow rate per $cm^2$ of the photo-crosslinkable resin layer is less than 0.030 L/minute, a failure in dissolving the insolubilized photo-crosslinkable resin layer component sometimes takes place. When the supply flow rate exceeds 1.0 L/minute, devices required for the supply, such as a pump, etc., are increased in size, and a large-scale apparatus is sometimes required. Further, at a flow rate of over 1.0 L/minute for the supply, there is sometimes produced almost no further effect on the dissolving and diffusion of the photo-crosslinkable resin layer component.

As a method for supplying the liquid in the step (b2), a spraying method is the most preferred in view of the dissolving speed of the photo-crosslinkable resin layer and the uniformity of the liquid supply. Concerning the direction of spraying, further, it is preferred to eject the liquid from the direction tilted against the direction perpendicular to the photo-crosslinkable resin layer surface in order to efficiently make a liquid flow on the photo-crosslinkable resin layer surface.

In the step (b) or step (b'), after the photo-crosslinkable resin layer is treated with the alkali aqueous solution, it is required to wash the substrate fully with water. By this washing of the substrate with water, micelles of the photo-crosslinkable resin layer which micelles are insolubilized with the alkali aqueous solution are readily dispersed again and removed. As a method for the washing with water, there are a dipping method, a paddle method, a spraying method, etc., and the spraying method is the most suitable from the viewpoint of the dissolving speed and uniformity of the photo-crosslinkable resin layer.

<Step (c)>

In the step (c), exposure for a circuit pattern is carried out. The method for exposure for a circuit pattern includes reflection image exposure using, as a light source, a xenon lamp, a high-pressure mercury lamp, a low-pressure mercury lamp, an ultra-high pressure mercury lamp or a UV fluorescent lamp, a one surface or double-surface intimate contact exposure method using an exposure mask, a proximity method, a projection method, a laser scanning exposure method, etc., while it is preferred to employ a one surface or double-surface intimate contact exposure method using, as a light source, a xenon lamp, a high-pressure mercury lamp, a low-pressure mercury lamp, an ultra-high pressure mercury lamp or a UV fluorescent lamp and using an exposure mask.

For suppressing an adverse effect caused by a halation that takes place on the substrate surface during the exposure for a circuit pattern, as specified in the method (7) for forming a conductor pattern in this invention, preferably, the photo-crosslinkable resin layer contains (A) a polymer containing a carboxyl group, (B) a photopolymerizable compound having at least one polymerizable ethylenically unsaturated group in a molecule, (C) a photopolymerization initiator and 0.01 to 0.3 mass %, based on the photo-crosslinkable resin layer, of (D) a polymerization inhibitor.

Examples of the (A) polymer containing a carboxyl group include organic polymers such as an acrylic resin, a methacrylic resin, a styrene resin, an epoxy resin, an amide resin, an amidoepoxy resin, an alkyd resin and a phenolic resin. These may be used singly or in combination of two or more of them. It is preferred to use an acrylic resin since it has high solubility in an alkali aqueous solution. The acrylic resin can be a polymer obtained by using (meth)acrylate as a main component and copolymerizing it with an ethylenically unsaturated carboxylic acid and other monomer having a copolymerizable ethylenically unsaturated group (to be referred to as "polymerizable" monomer).

Examples of the above (meth)acrylate include methyl (meth)acrylate, ethyl (meth)acrylate, isopropyl (meth)acrylate, n-butyl (meth)acrylate, isobutyl (meth)acrylate, n-hexyl (meth)acrylate, 2-ethylhexyl (meth)acrylate, cyclohexyl (meth)acrylate, benzyl (meth)acrylate, 2-hydroxyethyl (meth)acrylate, hydroxypropyl (meth)acrylate, glycidyl (meth)acrylate, lauryl (meth)acrylate, tetrahydrofurfuryl (meth)acrylate, 2-(dimethylamino)ethyl (meth)acrylate, 2-(diethylamino)ethyl (meth)acrylate, 2,2,2-trifluoroethyl (meth)acrylate, 2,2,3,3-tetrafluoropropyl (meth)acrylate, etc.

The above ethylenically unsaturated carboxylic acid is suitably selected from monocarboxylic acids such as acrylic acid, methacrylic acid, crotonic acid, etc., and it can be also selected from dicarboxylic acids such as maleic acid, fumaric acid, itaconic acid, etc., and anhydrides and half esters of these. Of these, acrylic acid and methacrylic acid are particularly preferred.

Examples of the above "other" polymerizable monomer include styrene, α-methylstyrene, p-methylstyrene, p-ethylstyrene, p-methoxystyrene, p-ethoxystyrene, p-chlorostyrene, p-bromostyrene, (meth) acrylonitrile, (meth)acrylamide, diacetoneacrylamide, vinyltoluene, vinyl acetate, vinyl-n-butyl ether, etc.

When two or more (A) polymers having a carboxyl group each are used in combination, examples of the combination include a combination of two or more polymers having different copolymerization components, a combination of two or more polymers having different mass average molecular weights, and a combination of two or more polymers having different dispersion degrees (mass average molecular weight/number average molecular weight).

The acid value of the (A) polymer having a carboxyl group is preferably 50 to 350 mgKOH/g, more preferably 100 to 300 mgKOH/g. When the alkali aqueous solution is used for the treatment to decrease the thickness of a layer, and when the above acid value is less than 50 mgKOH/g, not only it takes a long time before the photo-crosslinkable resin layer is dissolved, but also a failure in the dissolving tends to take place. When it exceeds 350 mgKOH/g, the dissolving and diffusion in the alkali solution proceed too quickly, and it tends to be difficult to control the layer thickness in the treatment to decrease the thickness of a layer. Further, the durability of a photocrosslinked portion against the developer is sometimes decreased, and a portion photocrosslinked in the step (c) is sometimes dissolved in the step (d).

The mass average molecular weight of the (A) polymer having a carboxyl group is preferably 10,000 to 150,000, more preferably 10,000 to 100,000. When the mass average molecular weight is less than 10,000, the durability against the alkali aqueous solution tends to decrease. On the other hand, when it exceeds 150,000, it tends to take too long a time before the photo-crosslinkable resin layer is dissolved.

The amount of the component (A) based on the total amount of the component (A) and the component (B) is preferably 40 to 65 mass %, more preferably 45 to 55 mass %. When the amount of the component (A) is less than 40 mass %, a photocrosslinked portion tends to decrease in chemical strength and mechanical strength. When the amount of the component (A) exceeds 65 mass %, the photocrosslinkability is sometimes decreased.

Examples of the (B) photopolymerizable compound having at least one polymerizable ethylenically unsaturated group in a molecule include a compound obtained by reacting polyhydric alcohol with α,β-unsaturated carboxylic acid; a bisphenol A (meth)acrylate compound; a compound obtained by reacting a glycidyl-group-containing compound with α,β-unsaturated carboxylic acid; urethane monomers such as a (meth)acrylate compound having a urethane bond in a molecule, etc.; nonylphenoxy-polyethyleneoxyacrylate; phthalic acid compounds such as γ-chloro-β-hydroxypropyl-β'-(meth)acryloyloxyethyl-o-phthalate, β-hydroxyalkyl-β'-((meth)acryloyloxyalkyl-o-phthalate, etc.; (meth)acrylic acid alkyl ester, EO- or PO-modified nonylphenyl (meth) acrylate, etc. The above EO and PO indicates ethylene oxide and propylene oxide. An EO-modified compound refers to a compound having a block structure of ethylene oxide groups, and a PO-modified compound refers to a compound having a block structure of propylene oxide groups. These photopolymerizable compounds may be used singly or in a combination of two or more of them.

As specified in the method (8) for forming a conductor pattern in this invention, the amount of the component (B) based on the photo-crosslinkable resin layer is preferably 35 to 55 mass %, more preferably 40 to 50 mass %. When the amount of the component (B) is less than 35 mass %, a semi-crosslinked region is liable to be generated in a non-exposed portion due to the influence of halation on the substrate surface, and the resolution can be degraded. When it exceeds 55 mass %, not only the tacking nature of the film surface sometimes clearly appears, but also a cured photo-crosslinkable resin layer can be fragile.

The (C) photopolymerization initiator includes aromatic ketones such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 2-benzyl-2-dimethylamino-1-(4-morpholinophenyl)-butanone-1,2-methyl-1-[4-methylthio]phenyl]-2-morpholino-propane-1, etc.; quinones such as 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, 2,3-dimethylanthraquinone, etc., and benzoin ether compounds such as benzoin methyl ether, benzoin ethyl ether, benzoin phenyl ether, etc.

Further, the (C) photopolymerization initiator includes benzoin compounds such as benzoin, methyl benzoin, ethyl benzoin, etc.; benzyl derivatives such as benzyl dimethyl ketal, etc.; 2,4,5-triarylimidazole dimers such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, a 2-(o-methoxyphenyl)-4,5-diphenylimidazole dimer, a 2-(p-methoxyphenyl)-4,5-diphenylimidazole dimer, etc.; acridine derivatives such as 9-phenylacridine, 1,7-bis(9,9'-acridinyl) heptanes, etc.; N-phenylglycine, N-phenylglycine derivatives, a coumarin compound, etc. In the above 2,4,5-triarylimidazole dimers, aryl group substituents of the two 2,4,5-triarylimidazoles may be the same substituents to give a symmetrical compound, or may be different substituents to give an asymmetric compound. Further, a thioxanthone compound and a tertiary amine compound may be combined like a combination of diethylthioxanthone and dimethylaminobenzoic acid. These may be used singly or in combination of two or more of them.

The amount of the component (C) based on the photo-crosslinkable resin layer is preferably 1 to 10 mass %, more preferably 2 to 8 mass %. When the above amount is less than 1 mass %, the photocrosslinkability tends to be insufficient. On the other hand, when it exceeds 10 mass %, absorption on the photo-crosslinkable resin layer surface increases during the exposure, and the photocrosslinking inside the resin layer tends to be insufficient.

The (D) polymerization inhibitor includes hydroquinone, p-methoxyphenol, tert-butyl-catechol, 2,6-di-tert-butyl-p-cresol, pyrogallol, β-naphthol, phenotiazine, etc. These may be used singly or in combination of two or more of them.

The amount of the component (D) based on the photo-crosslinkable resin layer is preferably 0.01 to 0.3 mass %, more preferably 0.03 to 0.2 mass %. When it is less than 0.01 mass %, there is produced little effect on the inhibition of the polymerizing reaction, and in the photo-crosslinkable resin layer, a semi-crosslinked portion of a non-exposed portion is liable to be generated. On the other hand, when it exceeds 0.3 mass %, the sensitivity of the photo-crosslinkable resin layer decreases greatly, and the crosslinking even in an exposed portion can be insufficient.

Further, the photo-crosslinkable resin layer may contain (E) a halation-preventing agent. When the component (E) is incorporated, it absorbs scattered light caused by reflection on the substrate surface, and it suppresses the generation of a semi-crosslinked portion in a non-exposed portion. The (E) halation-preventing agent may be any agent if it has an absorption wavelength region in the region of 280 to 430 nm. It includes halation-preventing dyes such as an acridine dye, an aniline dye, an anthraquinone dye, an azine dye, an azo dye, an azomethine dye, a benzoquinone dye, a naphthoquinone dye, an indigoid dye, indophenol, indoaniline, indamine, a naphtholimide dye, nigrosine and indulin, nitro and nitroso dyes, oxazine and an oxazine dye, oxidizing color, a phthalocyanine dye, a polymethine dye, a quinophthalone dye, a sulfide dye, triarylmethane and diarylmethane dyes, a thiazine dye, a thiazole dye, a xanthene dye, etc., inorganic and organic pigments, and phenyl salicylate, benzophenone, benzotriazole and acrylate ultraviolet absorbents.

The amount of the component (E) based on the photo-crosslinkable resin layer is sufficiently 0.05 to 0.5 mass %. When it is less than 0.05 mass %, the effect on the prevention of halation on the substrate surface is sometimes insufficient. When it exceeds 0.5 mass %, the sensitivity of the photo-crosslinkable resin layer greatly decreases, and the crosslinking even in an exposed portion sometimes gets insufficient.

<Step (d)>

In the step (d), the photo-crosslinkable resin layer portion that is not photocrosslinked is removed with a developer, to form an etching resist layer. For the development, a developer suitable for the photo-crosslinkable resin layer is used, and it is sprayed to the substrate surface from above and below the substrate to remove a portion that is unnecessary for the etching resist pattern and to form the etching resist layer corresponding to a circuit pattern. Generally, a 0.3 to 2 mass % sodium carbonate aqueous solution is used.

<Step (e)>

In the step (e), an exposed conductor layer other than the etching resist layer is etched thereby to form a fine conductor pattern. In the etching step, there can be employed a method described in "Printed Circuit Gijutsu Binran" (compiled by Japan Electronics Packaging and Circuit Association, 1987, issued by Nikkan Kogyo Shimbun, Ltd.), etc. The etchant may be any etchant that can remove a metal foil layer by dissolving it and against which the etching resist layer has durability. Generally, when copper is used as a conductor layer, a ferric chloride aqueous solution, a cupric chloride aqueous solution, etc., can be used.

<Steps (f) and (g)>

In the method (9) or (10) for forming a conductor pattern in this invention, a transparent film is stacked on the photo-crosslinkable resin layer in the step (f), and the transparent film is removed in the step (g). The photo-crosslinkable resin layer that has been treated to render it thinner sometimes has tacking nature depending upon a monomer and low-molecular-weight components such as an oligomer, etc., which are contained in the photo-crosslinkable resin layer. Owing to the step (f), a complete tackiness-free state can be obtained. When a transparent film is stacked on the photo-crosslinkable resin layer that has been treated to render it thinner, desirably, defects caused by foreign particles or scratches are remarkably reduced.

The transparent film in this invention can be selected from any films so long as they are films that can be stacked on the photo-crosslinkable resin layer after it is treated to render it thinner, that can be peeled off immediately before the development and that has a high transmittance to short-wavelength visible light and near ultraviolet ray. For example, it includes a polyester film, a polyethylene film, a polyvinyl chloride film, a polypropylene film, a polycarbonate film, etc., while a polyester film is preferred. The polyester refers to a polycondensation product from an aromatic dicarboxylic acid or aliphatic dicarboxylic acid and a diol as main components.

In the polyester for constituting the polyester film, the dicarboxylic acid component can be selected from aromatic dicarboxylic acids such as terephthalic acid, isophthalic acid, phthalic acid, naphthalenedicarboxylic acid, etc., aliphatic carboxylic acids such as adipic acid, azelaic acid, sebacic acid, decanedicarboxylic acid, etc., and alicyclic dicarboxylic acids such as cyclohexanedicarboxylic acid, etc. The diol component can be selected from aliphatic diols such as ethylene glycol, diethylene glycol, butanediol, pentanediol, hexanediol, etc., and alicyclic diols such as cyclohexanedimethanol, etc.

Of the polyester films, it is particularly preferred to use, as a transparent film, a film composed mainly of polyethylene terephthalate produced by dehydrative polymerization of terephthalic acid and ethylene glycol. The polyethylene terephthalate film has solvent resistance and mechanical strength and is excellent in suitability to laminating and suitability to peeling. Further, it is excellent in transmittance and refractivity as an optical film, and it is also economically advantageous and hence accessible.

Further, the haze value H of the transparent film is preferably 10% or less, more preferably 5% or less, still more preferably 1.5% or less. The haze value H refers to a value that represents a turbidity, and it is determined by H (%)=(D/T)× 100 in which T is a total transmittance of light that passes through a sample and D is a transmittance of light diffused and scattered in the sample. It is defined according to JIS-K-7105, and is easily measurable by means of a commercially available haze meter (e.g., trade name: NDH-500, supplied by NIPPON DENSHOKU INDUSTRIES CO., LTD.). When the haze value exceeds 10%, the film has low transmissivity and may hamper the photocrosslinking. The transparent film having a haze value of 10% or less includes, for example, Teijin Tetolon film (trade name, supplied by supplied by Teijin DuPont Films Japan Limited), Mylar (trade name, supplied by supplied by Teijin DuPont Films Japan Limited), Melinex (trade name, supplied by supplied by Teijin DuPont Films Japan Limited), Diafoil (supplied by Mitsubishi Plastics, Inc.), RUMIRROR (trade name, supplied by TORAY ADVANCED FILM CO, LTD.), etc.

The thickness of the transparent film is preferably 10 to 25 μm, more preferably 12 to 25 μm. When it exceeds 25 μm, the resolution may decrease, or such a film may be economically disadvantageous. When it is less than 10 μm, the film is insufficient in mechanical strength and may be easily broken when it is peeled off.

For stacking the transparent film on the photo-crosslinkable resin layer that has been treated to render it thinner, any method can be employed so long as the transparent film can be nearly uniformly stacked on the photo-crosslinkable resin layer without causing a gap between the photo-crosslinkable resin layer and the transparent film, without catching air and foreign matters and without any undulation. For example, there can be employed a laminator apparatus according to a pressing method in which a rubber roll is pressed under pressure. In this case, the rubber roll may be heated or may not be heated, while it is required to adjust the pressure, the carrying speed and the heating temperature for the rubber roll in order to keep the photo-crosslinkable resin layer from coming and flowing out from between the substrate and the transparent film.

EXAMPLES

This invention will be explained further in detail with reference to Examples hereinafter, while it shall not be limited by these Examples.

Example 1

Step (a)

A dry film resist (trade name: Sunfort AQ2575, thickness 25 supplied by Asahi Kasei E-Materials) was laminated on an glass substrate epoxy resin copper-clad laminate (area 170 mm×255 mm, copper foil thickness 12 with, substrate thickness 0.1 mm, trade name: CCL-E170, supplied by Mitsubishi Gas Chemical Co., Inc.) by means of a dry film laminator having a laminating roll that was surface-treated for heat-resistant silicon rubber lining, with peeling off a protective film at a room temperature of 100° C. at an air supply pressure of 0.30 MPa and at a laminating speed of 0.50 m/minute.

Step (b)

After a supporting film was removed, the photo-crosslinkable resin layer was treated with an alkali aqueous solution A shown in Table 1 (liquid temperature 25° C., spray pressure 0.05 MPa) for a treatment time period shown in Table 2 such that the photo-crosslinkable resin layer had an average thickness of 10 μm, and it was fully washed with water and dried with cold air to give a thickness-decreased photo-crosslinkable resin layer. The photo-crosslinkable resin layer after the treatment to render it thinner was measured for thicknesses in 10 points, and evaluated for thickness variability on the basis of values of the standard deviation σ.

TABLE 1

| Example | Alkali aqueous solution | Components | Amounts (part by mass) |
|---|---|---|---|
| 1 | Alkali aqueous solution A | Sodium carbonate Water | 10 90 |
| 2 | Alkali aqueous solution B | Sodium tertiary phosphate, Water | 10 90 |
| 3 | Alkali aqueous solution C | Sodium hydroxide Water | 10 90 |
| 4 | Alkali aqueous solution D | Sodium silicate Water | 10 90 |
| 5 | Alkali aqueous solution E | Sodium carbonate Water | 5 95 |
| 6 | Alkali aqueous solution F | Sodium carbonate Water | 7 93 |
| 7 | Alkali aqueous solution G | Sodium carbonate Water | 15 85 |
| 8 | Alkali aqueous solution H | Sodium carbonate Water | 20 80 |
| 9 | Alkali aqueous solution AH | Sodium sulfite Water | 5 95 |
| 10 | Alkali aqueous solution AI | Sodium sulfite Water | 10 90 |

TABLE 2

| Example | Alkali aqueous solution | Treatment time period (second) | Thickness variability, Standard deviation σ |
|---|---|---|---|
| 1 | Alkali aqueous solution A | 23 | 0.9 |
| 2 | Alkali aqueous solution B | 15 | 0.9 |
| 3 | Alkali aqueous solution C | 16 | 1.2 |
| 4 | Alkali aqueous solution D | 14 | 0.9 |
| 5 | Alkali aqueous solution E | 15 | 1.2 |
| 6 | Alkali aqueous solution F | 20 | 1.0 |
| 7 | Alkali aqueous solution G | 43 | 0.7 |
| 8 | Alkali aqueous solution H | 60 | 0.4 |
| 9 | Alkali aqueous solution AH | 22 | 1.0 |
| 10 | Alkali aqueous solution AI | 35 | 0.8 |

Step (c)

Intimate contact exposure was carried out with a vacuum intimate contact exposure apparatus having an ultra-high pressure mercury lamp (trade name: URM-300, supplied by Ushio Lighting Inc.) through an exposure mask having a drawn pattern of line/space=20/20 μm.

Step (d)

A developing treatment was carried out with a 1 mass % sodium carbonate aqueous solution (liquid temperature 30° C., spray pressure 0.15 MPa) to form an etching resist layer. The thus-obtained etching resist layer was observed through an optical microscope, and as a result, no defects of a narrowed line, a broken line, a thickened line, a short circuit, etc., were observed in a line/space=20/20 μm pattern.

Step (e)

Etching was carried out by treating the substrate having the etching resist layer formed thereon with a ferric chloride solution (liquid temperature 40° C., spray pressure 0.20 MPa) and thereby removing copper foil other than the etching resist layer. Then, a remaining etching resist layer was removed with a 3 mass % sodium hydroxide solution at 40° C. to give a conductor pattern. No defects of a broken line and a short circuit were observed in the thus-obtained conductor pattern.

Examples 2-10

Conductor patterns were formed in the same manner as in Example 1 except that the alkali aqueous solution A was replaced with alkali aqueous solutions B to H, AH and AI described in Table 1. Each photo-crosslinkable resin layer after the treatment to render it thinner was measured for thicknesses in 10 points, and evaluated for thickness variability on the basis of values of the standard deviation σ. Table 2 shows the results. In each of Examples 2 to 10, the value of the standard deviation was small, and good in-plane uniformity was obtained. Further, there were observed no defects of a broken line and a short circuit that would be a practical problem. In Examples 9 and 10 that used sodium sulfite as the inorganic alkaline compound, the photo-crosslinkable resin layers were good with regard to freedom from the in-plane variability of layer thickness, while on the surface of each photo-crosslinkable resin layer after the treatment to render them thinner was carried out, there was found low tacking nature caused by the precipitation of a non-dissolved component. On the thus-obtained conductor patterns, there were observed no defects of a broken line and a short circuit that would be a practical problem.

Comparative Examples 1-5

Conductor patterns were formed in the same manner as in Example 1 except that the alkali aqueous solution was replaced with alkali aqueous solutions AA to AE shown in Table 3. In each Comparative Example, the treatment to render each photo-crosslinkable resin layer thinner was carried out for a treatment time period shown in Table 4, and then each photo-crosslinkable resin layer was measured for thicknesses in 10 points, and evaluated for thickness variability on the basis of values of the standard deviation σ. Table 4 shows the results. In Comparative Examples 1 to 5 using the alkali aqueous solutions having small contents of inorganic alkaline compounds, the values of the standard deviation were large, and clear variability of in-plane thickness was found. Further, the thus-obtained conductor patterns were observed through an optical microscope, as a result, short circuit defects partly occurred in portions of line and space of 20 μm, and there were formed no conductor patterns having in-plane virtual uniformity.

TABLE 3

| CEx. | Alkali aqueous solution | Components | Amounts (part by mass) |
|---|---|---|---|
| 1 | Alkali aqueous solution AA | Sodium carbonate Water | 1 99 |
| 2 | Alkali aqueous solution AB | Sodium carbonate Water | 4 96 |
| 3 | Alkali aqueous solution AC | Sodium tertiary phosphate, water | 1 99 |
| 4 | Alkali aqueous solution AD | Sodium hydroxide Water | 1 99 |
| 5 | Alkali aqueous solution AE | Sodium silicate Water | 1 99 |
| 6 | Alkali aqueous solution AF | Sodium carbonate Water | 23 77 |
| 7 | Alkali aqueous solution AG | Sodium tertiary phosphate, water | 23 77 |

CEx. = Comparative Example

TABLE 4

| Comparative Example | Alkali aqueous solution | Treatment time period (second) | Thickness variability, Standard deviation σ |
|---|---|---|---|
| 1 | Alkali aqueous solution AA | 18 | 3.1 |
| 2 | Alkali aqueous solution AB | 11 | 2.6 |
| 3 | Alkali aqueous solution AC | 30 | 3.2 |
| 4 | Alkali aqueous solution AD | 10 | 3.6 |
| 5 | Alkali aqueous solution AE | 20 | 3.2 |

Comparative Examples 6-7

Alkali aqueous solutions AF and AG shown in Table 3 were prepared. When they were left at 25° C. for 10 days or more, precipitates were formed. Further, there was caused a problem that the precipitates plugged up a pump when the treatments to render layers thinner were carried out.

Examples 11-28

Conductor patterns were formed in the same manner as in Example 1 except that the alkali aqueous solution was replaced with alkali aqueous solutions I to Z shown in Table 5 and that the treatments to render layers thinner were carried out by dipping photo-crosslinkable resin layers in the alkali aqueous solutions in addition to the spray treatment of ejecting alkali aqueous solutions at a spray pressure of 0.05 MPa, fully washing them with water and drying them by cold air. The dipping time periods and the spray ejecting time periods were adjusted such that the photo-crosslinkable resin layer after the treatments to render them thinner had an average thickness of 10 μm.

TABLE 5

| Example | Alkali aqueous solution | Components | Amounts (part by mass (molar concentration)) |
|---|---|---|---|
| 11 | Alkali aqueous solution I | Sodium carbonate Sodium sulfite Water | 5 2 (0.17) 93 |
| 12 | Alkali aqueous solution J | Sodium carbonate Sodium sulfite Water | 10 2 (0.18) 88 |
| 13 | Alkali aqueous solution K | Sodium carbonate Sodium sulfite Water | 15 2 (0.19) 83 |
| 14 | Alkali aqueous solution L | Sodium carbonate Sodium sulfite Water | 20 2 (0.20) 78 |
| 15 | Alkali aqueous solution M | Sodium carbonate Sodium sulfite Water | 10 0.5 (0.04) 89.5 |
| 16 | Alkali aqueous solution N | Sodium carbonate Sodium sulfite Water | 10 0.65 (0.06) 89.35 |
| 17 | Alkali aqueous solution O | Sodium carbonate Sodium sulfite Water | 10 5 (0.47) 85 |
| 18 | Alkali aqueous solution P | Sodium carbonate Sodium sulfite Water | 10 8 (0.77) 82 |
| 19 | Alkali aqueous solution Q | Sodium carbonate Sodium sulfite Water | 10 10 (0.99) 80 |
| 20 | Alkali aqueous solution R | Sodium carbonate Sodium sulfite Water | 10 10.5 (1.05) 79.5 |
| 21 | Alkali aqueous solution S | Potassium carbonate Potassium sulfite Water | 10 2 (0.14) 88 |
| 22 | Alkali aqueous solution T | Sodium tertiary phosphate Sodium sulfite Water | 10 2 (0.18) 88 |
| 23 | Alkali aqueous solution U | Sodium hydroxide Sodium sulfite Water | 10 2 (0.18) 88 |
| 24 | Alkali aqueous solution V | Sodium silicate Sodium sulfite Water | 10 2 (0.18) 88 |
| 25 | Alkali aqueous solution W | Sodium carbonate Potassium sulfite Water | 10 2 (0.14) 88 |

TABLE 5-continued

| Example | Alkali aqueous solution | Components | Amounts (part by mass (molar concentration)) |
|---|---|---|---|
| 26 | Alkali aqueous solution X | Sodium carbonate | 10 |
| | | Sodium sulfate | 2 (0.16) |
| | | Water | 88 |
| 27 | Alkali aqueous solution Y | Sodium carbonate | 10 |
| | | Sodium sulfite | 1 (0.09) |
| | | Sodium sulfate | 1 (0.08) |
| | | Water | 88 |
| 28 | Alkali aqueous solution Z | Sodium carbonate | 10 |
| | | Sodium sulfite | 1 (0.09) |
| | | Potassium sulfite | 1 (0.07) |
| | | Sodium sulfate | 1 (0.08) |
| | | Water | 87 |

Table 6 shows time periods required for the treatments to decrease the thickness of each layer and ratios of time periods required for dipping to the time periods required for spraying in Examples 11 to 28. When double surface treatment is continuously carried out by means of a continuous treatment apparatus of a horizontally carrying system having spray nozzles arranged above and below a layer, the treatment liquid ejected by a spray is not easily eliminated from the upper surface treated, and treatment liquid stays on the treated substrate to bring about a nearly dipped state. On the other hand, on the lower surface treated, the treatment liquid ejected from the spray is readily eliminated, and the treatment surface of the substrate is constantly treated with the treatment liquid ejected from the spray. It is shown that as the ratio of a time period required for dipping to a time period required for spraying is closer to 1, the difference between the dipping treatment and the spraying treatment is smaller in the state where the thickness of a layer is decreased, and even when a horizontally carrying continuous treatment apparatus is used, the treatment to render layers thinner in upper and lower surfaces can be nearly uniformly carried out.

TABLE 6

| | Alkali aqueous solution | TDT | TTP (second) | Ratio of TTPs (times) | Variability of layer thickness Standard deviation σ |
|---|---|---|---|---|---|
| Ex. 11 | I | Dipping | 25 | 1.3 | 1.0 |
| | | Spray | 20 | | 1.1 |
| Ex. 12 | J | Dipping | 40 | 1.1 | 0.8 |
| | | Spray | 35 | | 0.9 |
| Ex. 13 | K | Dipping | 75 | 1.2 | 0.6 |
| | | Spray | 65 | | 0.7 |
| Ex. 14 | L | Dipping | 100 | 1.1 | 0.4 |
| | | Spray | 90 | | 0.4 |
| Ex. 15 | M | Dipping | 25 | 1.4 | 1.0 |
| | | Spray | 18 | | 1.3 |
| Ex. 16 | N | Dipping | 25 | 1.3 | 1.0 |
| | | Spray | 20 | | 1.2 |
| Ex. 17 | O | Dipping | 55 | 1.1 | 0.7 |
| | | Spray | 50 | | 0.8 |
| Ex. 18 | P | Dipping | 70 | 1.2 | 0.6 |
| | | Spray | 60 | | 0.7 |
| Ex. 19 | Q | Dipping | 90 | 1.1 | 0.4 |
| | | Spray | 80 | | 0.5 |
| Ex. 20 | R | Dipping | 120 | 1.1 | 0.4 |
| | | Spray | 110 | | 0.5 |
| Ex. 21 | S | Dipping | 35 | 1.2 | 0.9 |
| | | Spray | 30 | | 1.0 |
| Ex. 22 | T | Dipping | 40 | 1.1 | 0.8 |
| | | Spray | 35 | | 0.9 |
| Ex. 23 | U | Dipping | 40 | 1.1 | 0.8 |
| | | Spray | 35 | | 0.9 |
| Ex. 24 | V | Dipping | 40 | 1.1 | 0.8 |
| | | Spray | 35 | | 0.9 |
| Ex. 25 | W | Dipping | 35 | 1.2 | 0.7 |
| | | Spray | 30 | | 0.8 |
| Ex. 26 | X | Dipping | 40 | 1.1 | 0.8 |
| | | Spray | 35 | | 0.9 |
| Ex. 27 | Y | Dipping | 40 | 1.1 | 0.8 |
| | | Spray | 35 | | 0.9 |
| Ex. 28 | Z | Dipping | 45 | 1.1 | 0.8 |
| | | Spray | 40 | | 0.9 |

Ex. = Example, TDT = Treatment to decrease the layer thickness, TTP = Treatment time period In Examples 11 to 28, in all of the alkaline aqueous solutions, the treatment time period required is 1.1 to 1.4 times, and the difference between the dipping treatment and the spray treatment in the treatment time period is small. It has been found that even when the continuous treatment apparatus of the horizontally carrying system is used, both the upper surface and lower surface can be nearly uniformly treated. In Example 20 in which the aqueous solution has a large content of sodium sulfite, the precipitation of a slight amount of a non-dissolved component was observed on the surface of the photo-crosslinkable resin layer after it was treated to render it thinner, and low tacking nature was found thereon.

After the treatment to render the photo-crosslinkable resin layers thinner, each photo-crosslinkable resin layer was measured for thicknesses in 10 points, and evaluated for thickness variability on the basis of values of the standard deviation σ. Table 6 shows the results. In each alkali aqueous solution, the difference between the dipping treatment and the spray treatment in the standard deviation was small, and there was obtained good in-plane uniformity. In the thus-obtained conductor pattern, further, there was found no broken line or short circuit defect that could be a problem in practical use.

Comparative Examples 8-10

Conductor patterns were formed in the same manner as in Example 11 except that the alkali aqueous solution was replaced with alkali aqueous solutions AJ to AL shown in Table 7. Table 8 shows required treatment time periods and a ratio of the time period required for dipping to time period required for spraying in each Comparative Example. In any alkali aqueous solution, the ratio of the required time periods was 2 times or more, and there was caused a large difference between the treatment methods in treatment time period. That is, it is shown that when a continuous treatment apparatus of a horizontally carrying system is used, it is difficult to nearly uniformly treat the upper and lower surfaces. Table 8 shows the variability of film thickness of dry film resists obtained after they were treated to render them thinner. In the spray treatment, the value of the standard deviation was large as compared with that in the dipping treatment, and the variability of in-plane film thickness was clearly found. Further, the conductor patterns obtained by the dipping treatment and the spray treatment were observed through an optical microscope, and as a result, it was found that a short-circuit defect partly occurred in a portion of line and space of 20 μm in Comparative Example 10, and not nay conductor pattern having approximately in-plane uniformity was formed.

TABLE 7

| CEx. | Alkali aqueous solution | Components | Amount (part by mass (molar concentration) |
|---|---|---|---|
| 8 | Alkali aqueous solution AJ | Sodium carbonate<br>Water | 5<br>95 |
| 9 | Alkali aqueous solution AK | Sodium carbonate<br>Water | 10<br>90 |
| 10 | Alkali aqueous solution AL | Sodium carbonate<br>Sodium sulfite<br>Water | 4<br>2 (0.17)<br>94 |
| 11 | Alkali aqueous solution AM | Sodium carbonate<br>Sodium sulfite<br>Water | 22<br>2 (0.21)<br>76 |

CEx. = Comparative Example

TABLE 8

| | Alkali aqueous solution | TDT | TTP (second) | Ratio of TTPs (times) | Variability of layer thickness Standard deviation σ |
|---|---|---|---|---|---|
| CEx. 8 | AJ | Dipping<br>Spray | 15<br>7 | 2.1 | 1.3<br>1.7 |
| CEx. 9 | AK | Dipping<br>Spray | 25<br>12 | 2.1 | 1.0<br>1.4 |
| CEx. 10 | AL | Dipping<br>Spray | 15<br>5 | 3.0 | 1.4<br>1.9 |

CEx. = Comparative Example, TDT = Treatment to decrease thickness, TTP = Treatment time period Comparative Example 11

An alkali aqueous solution AM shown in Table 7 was prepared. When it was left at 25° C. for 10 days or more, a precipitate was formed. Further, when the treatment to render the layer thinner was carried out, there was caused a problem that the precipitate plugged up a pump.

Examples 29-54

Conductor patterns were formed in the same manner as in Example 1 except that the treatment of the photo-crosslinkable resin layer to render it thinner was carried out by replacing the alkali aqueous solution with alkali aqueous solutions (b1) A to Z shown in Table 9, then supplying treatment liquids (b2) A to Z at flow rates shown in Table 9, and carrying out full washing and drying with cold air. Further, the pH of each of the treatment liquids (b2) A to Z was adjusted by adding sulfuric acid. Each photo-crosslinkable resin layer was measured for thicknesses in 10 points, and evaluated for thickness variability on the basis of values of the standard deviation σ. Table 10 shows the results. In Example 33 in which the treatment liquid (b2) had a high pH and Examples 41 and 42 in which the supply flow rate was low, the standard deviation was large to some extent, and in Example 41, further, the surface of the photo-crosslinkable resin layer after the treatment to render it thinner was found to have low tacking nature caused by the precipitation of a non-dissolved component. In any other Example, good in-plane uniformity was obtained by adjusting the pH and supply flow rate of (b2) properly. Further, in the thus-obtained conductor patterns, there were found no defects of a broken line or short circuit that would be a problem in practical use.

TABLE 9

| | | (b1) liquid | | | (b2) liquid | | | |
|---|---|---|---|---|---|---|---|---|
| Ex. | No. | Components | *1 | No. | Components | *1 | pH | *2 |
| 29 | A | Sodium carbonate<br>Water | 10<br>90 | A | Sodium carbonate<br>Water | 0.1<br>99.9 | 5.1 | 0.2 |
| 30 | B | Sodium carbonate<br>Water | 10<br>90 | B | Sodium carbonate<br>Water | 0.1<br>99.9 | 6.5 | 0.2 |
| 31 | C | Sodium carbonate<br>Water | 10<br>90 | C | Sodium carbonate<br>Water | 0.1<br>99.9 | 7.8 | 0.2 |
| 32 | D | Sodium carbonate<br>Water | 10<br>90 | D | Sodium carbonate<br>Water | 0.1<br>99.9 | 9.0 | 0.2 |
| 33 | E | Sodium carbonate<br>Water | 10<br>90 | E | Sodium carbonate<br>Water | 0.1<br>99.9 | 9.8 | 0.2 |
| 34 | F | Sodium tertiary phosphate<br>Water | 10<br>90 | F | Sodium carbonate<br>Water | 0.1<br>99.9 | 8.2 | 0.2 |
| 35 | G | Sodium hydroxide<br>Water | 10<br>90 | G | Sodium carbonate<br>Water | 0.1<br>99.9 | 8.1 | 0.2 |
| 36 | H | Sodium silicate<br>Water | 10<br>90 | H | Sodium carbonate<br>Water | 0.1<br>99.9 | 8.4 | 0.2 |
| 37 | I | Potassium carbonate<br>Water | 10<br>90 | I | Sodium carbonate<br>Water | 0.1<br>99.9 | 8.2 | 0.2 |
| 38 | J | Sodium carbonate<br>Water | 5<br>95 | J | Sodium carbonate<br>Water | 0.1<br>99.9 | 8.1 | 0.2 |
| 39 | K | Sodium carbonate<br>Water | 15<br>85 | K | Sodium carbonate<br>Water | 0.1<br>99.9 | 8.2 | 0.2 |
| 40 | L | Sodium carbonate<br>Water | 20<br>80 | L | Sodium carbonate<br>Water | 0.1<br>99.9 | 8.3 | 0.2 |
| 41 | M | Sodium carbonate<br>Water | 10<br>90 | M | Sodium carbonate<br>Water | 0.1<br>99.9 | 8.3 | 0.01 |
| 42 | N | Sodium carbonate<br>Water | 10<br>90 | N | Sodium carbonate<br>Water | 0.1<br>99.9 | 8.3 | 0.03 |
| 43 | O | Sodium carbonate<br>Water | 10<br>90 | O | Sodium carbonate<br>Water | 0.1<br>99.9 | 8.3 | 0.1 |
| 44 | P | Sodium carbonate<br>Water | 10<br>90 | P | Sodium carbonate<br>Water | 0.1<br>99.9 | 8.3 | 0.5 |
| 45 | Q | Sodium carbonate<br>Water | 10<br>90 | Q | Sodium carbonate<br>Water | 0.1<br>99.9 | 8.3 | 1.0 |
| 46 | R | Sodium carbonate<br>Water | 10<br>90 | R | Sodium carbonate<br>Water | 0.1<br>99.9 | 8.3 | 1.5 |
| 47 | S | Sodium carbonate<br>Water | 10<br>90 | S | Sodium tertiary phosphate<br>Water | 0.1<br>99.9 | 8.1 | 0.2 |
| 48 | T | Sodium carbonate<br>Water | 10<br>90 | T | Sodium silicate<br>Water | 0.1<br>99.9 | 8.0 | 0.2 |
| 49 | U | Sodium carbonate<br>Water | 10<br>90 | U | Potassium carbonate<br>Water | 0.1<br>99.9 | 8.3 | 0.2 |
| 50 | V | Sodium carbonate<br>Sodium sulfite<br>Water | 10<br>2<br>88 | V | Sodium carbonate<br>Water | 0.1<br>99.9 | 8.1 | 0.2 |
| 51 | W | Sodium tertiary phosphate<br>Sodium sulfite<br>Water | 10<br>2<br>88 | W | Sodium carbonate<br>Water | 0.1<br>99.9 | 8.0 | 0.2 |

TABLE 9-continued

| | | (b1) liquid | | | (b2) liquid | | | |
|---|---|---|---|---|---|---|---|---|
| Ex. | No. | Components | *1 | No. | Components | *1 | pH | *2 |
| 52 | X | Sodium silicate | 10 | X | Sodium carbonate | 0.1 | 8.2 | 0.2 |
| | | Sodium sulfite | 2 | | Water | 99.9 | | |
| | | Water | 88 | | | | | |
| 53 | Y | potassium carbonate | 10 | Y | Sodium carbonate | 0.1 | 8.0 | 0.2 |
| | | Potassium sulfite | 2 | | Water | 99.9 | | |
| | | Water | 88 | | | | | |
| 54 | Z | Sodium carbonate | 10 | Z | Sodium carbonate | 0.1 | 8.1 | 0.2 |
| | | Sodium sulfate | 2 | | Water | 99.9 | | |
| | | Water | 88 | | | | | |

Ex. = Example,
*1: Amount (part by mass),
*2: Supply flow rate (L/min)

TABLE 10

| Example | Variability of layer thickness Standard deviation σ |
|---|---|
| 29 | 0.9 |
| 30 | 0.9 |
| 31 | 0.9 |
| 32 | 1.1 |
| 33 | 1.4 |
| 34 | 0.9 |
| 35 | 1.2 |
| 36 | 0.9 |
| 37 | 0.9 |
| 38 | 1.2 |
| 39 | 0.7 |
| 40 | 0.4 |
| 41 | 1.7 |
| 42 | 1.4 |
| 43 | 1.0 |
| 44 | 0.5 |
| 45 | 0.4 |
| 46 | 0.4 |
| 47 | 0.9 |
| 48 | 0.9 |
| 49 | 0.9 |
| 50 | 0.9 |
| 51 | 0.9 |
| 52 | 0.9 |
| 53 | 1.0 |
| 54 | 0.9 |

Examples 55-56 and Comparative Example 12

Conductor patterns were formed in the same manner as in Example 29 except that the treatment of the photo-crosslinkable resin layer to render it thinner was carried out by replacing the alkali aqueous solution with alkali aqueous solutions (b1) AA to AC shown in Table 11, then supplying the treatment liquids (b2) AA to AC at flow rates shown in Table 11, and carrying out full washing and drying with cold air. Further, the pH of each of the treatment liquids (b2) AA to AC was adjusted by adding sulfuric acid. Each photo-crosslinkable resin layer was measured for thicknesses in 10 points, and evaluated for thickness variability on the basis of values of the standard deviation σ. Table 12 shows the results. In Example 55 in which the treatment liquid (b2) had a pH of lower than 5, aggregates of a non-dissolved component of the photo-crosslinkable resin layer could be generated in the treatment liquid (b2), and the aggregates adhered again after the treatment to decrease the layer thickness, while the value of the standard deviation was small. On the other hand, in Example 56 in which the treatment liquid (b2) had a pH of higher than 10, an insolubilized photo-crosslinkable resin layer component was dispersed again and at the same the treatment liquid (b2) dissolved the photo-crosslinkable resin layer, so that it was observed that the value of the standard deviation tended to increase. In Comparative Example 12, the inorganic alkaline compound concentration in the alkali aqueous solution (b1) was low, so that there was found a clear variability of in-plane layer thickness. When the thus-obtained conductor pattern was observed through an optical microscope, further, a short circuit defect partly occurred in portions of line and space of 20 μm, and there was formed no conductor pattern having in-plane virtual uniformity.

TABLE 11

| | | (b1) liquid | | | (b2) liquid | | | |
|---|---|---|---|---|---|---|---|---|
| Ex. | No. | Components | *1 | No. | Components | *1 | pH | *2 |
| Ex. 55 | AA | Sodium carbonate | 10 | AA | Sodium carbonate | 0.1 | 4.8 | 0.2 |
| | | Water | 90 | | Water | 99.9 | | |
| Ex. 56 | AB | Sodium carbonate | 10 | AB | Sodium carbonate | 0.1 | 10.3 | 0.2 |
| | | Water | 90 | | Water | 99.9 | | |
| CEx. 12 | AC | Sodium carbonate | 4 | AC | Sodium carbonate | 0.1 | 8.0 | 0.2 |
| | | Water | 96 | | Water | 99.9 | | |
| CEx. 13 | AD | Sodium carbonate | 23 | AD | Sodium carbonate | 0.1 | 8.1 | 0.2 |
| | | Water | 77 | | Water | 99.9 | | |

Ex. = Example, CEx. = Comparative Example,
*1: Amount (part by mass),
*2: Supply flow rate (L/min)

TABLE 12

| | Variability of layer thickness Standard deviation σ |
|---|---|
| Example 55 | 0.9 |
| Example 56 | 3.3 |
| Comparative Example 12 | 2.6 |

Comparative Example 13

An alkali aqueous solution (b1) AD shown in Table 11 was prepared. When it was left at 25° C. for 10 days or more, a precipitate was formed. Further, when the treatment to render the layer thinner was carried out, there was caused a problem that the precipitate plugged up a pump.

Examples 57-60 and Comparative Example 14

For studying the stability of the treatment to render layers thinner, conductor patterns were formed in the same manner as in Example 29 except that the treatment of photo-crosslinkable resin layers to render them thinner was carried out by treating them with alkali aqueous solutions (b1) AAA to AAE shown in Table 13, then supplying treatment liquids (b2) AAA to AAE at liquid supply flow rates shown in Table 13 and carrying out full washing with water and drying with cold air. Further, the Ph of each of the treatment liquids (b2) AAA to AAE was adjusted by adding sulfuric acid before the first photo-crosslinkable resin layers were treated to render them thinner. During the continuous treatment of the layers to render them thinner, the pH of each of the treatment liquids (b2) AAA to AAE was not adjusted for each photo-crosslinkable resin layer, Each of the first photo-crosslinkable resin layers, fifth photo-crosslinkable resin layers and tenth photo-crosslinkable resin layers that had been treated to render them thinner was measured for thicknesses in 10 points, and evaluated for thickness variability on the basis of values of the standard deviation σ. For studying the dissolving of photo-crosslinkable resin layers in the alkali aqueous solutions (b1) after the treatments of the tenth photo-crosslinkable resin layers to render them thinner, each solution was visually observed for turbidity. Table 14 shows the turbidity of the alkali aqueous solutions (b1) and the pH's of the treatment liquids (b2) AAA to AAE after the tenth photo-crosslinkable resin layers were treated to render them thinner and the results of the layer thickness variability (standard deviation σ).

In Comparative Example 14 in which the inorganic alkaline compound concentration in the alkali aqueous solution (b1) was outside this invention, the rise of pH of the treatment liquid (b2) was small in the fifth and tenth photo-crosslinkable resin layers that were treated to render them thinner, while the value of the standard deviation was large after the first one was treated, and the variability of layer thickness was clearly found regardless of how many photo-crosslinkable resin layers were treated to render them thinner. After the tenth one was treated, further, the turbidity caused by the dissolving of photo-crosslinkable resin layers in the alkali aqueous solution (b1) was observed, and there was concern that the dissolving capability of alkali aqueous solution would be deteriorated by an increase in the number of photo-crosslinkable resin layers. Further, the conductor patterns formed on the substrates after the substrates had been treated to render them thinner were observed through an optical microscope, short circuit defects occurred partly in some portions of line and space of 20 μm each, and not any conductor pattern having in-plane virtual uniformity could be formed. In Example 57 in which water was used as the treatment liquid (b2), it was observed that the pH of the treatment liquid (b2) increased as the number of the photo-crosslinkable resin layers increased up to five and ten. After the tenth one was treated, the pH of the treatment liquid (b2) exceeded 10, the value of the standard deviation was large, and a clear variability of the layer thickness was found. Further, the thus-obtained conductor patterns were observed through an optical microscope. As a result, in the substrates after the fifth one was treated, there were found no defects of a broken line or short circuit that would be a problem in practical use in portions of line/space=20 μm/20 μm. In the substrates after the tenth one was treated, a short circuit defect partly occurred, and there could not be formed any conductor pattern having in-plane virtual uniformity. In Examples 58 to 60 in which aqueous solutions having buffering capability were used as the treatment liquid (b2), the rise of the pH of each treatment liquid both after the treatment of the fifth one and the tenth one was small, and in each case, the pH was suppressed such that it was less than 10, and the layer thickness was good with regard to its variability. In the conductor patterns formed on the substrates after the fifth one and tenth one had been treated, there was found no defect of a broken line or short circuit that would be a problem in practical use. In Examples 57 to 60, further, after the tenth one was treated, the turbidity caused by the dissolving of photo-crosslinkable resin layer in the alkali aqueous solution (b1) was not observed, and it was suggested that the alkaline aqueous solutions were stable in the continuous treatment.

TABLE 13

| Ex. No. | (b1) liquid | | | (b2) liquid | | | |
| --- | --- | --- | --- | --- | --- | --- | --- |
| | No. | Components | *1 | No. | Component | *1 | pH | *2 |
| Ex. 57 | AAA | Sodium carbonate | 10 | AAA | Water | 100 | 7.1 | 0.2 |
| | | Water | 90 | | | | | |
| Ex. 58 | AAB | Sodium carbonate | 10 | AAB | Sodium carbonate | 0.1 | 6.9 | 0.2 |
| | | Water | 90 | | Water | 99.9 | | |
| Ex. 59 | AAC | Sodium carbonate | 10 | AAC | Sodium tertiary phosphate | 0.1 | 6.8 | 0.2 |
| | | Water | 90 | | Water | 99.9 | | |
| Ex. 60 | AAD | Sodium carbonate | 10 | AAD | Sodium silicate | 0.1 | 7.1 | 0.2 |
| | | Water | 90 | | Water | 99.9 | | |
| CEx. 14 | AAE | Sodium carbonate | 1 | AAE | Water | 100 | 7.1 | 0.2 |
| | | Water | 90 | | | | | |

Ex. = Example, CEx. = Comparative Example
*1: Amount (part by mass),
*2: Supply flow rate (L/min)

TABLE 14

| | Turbidity of liquid (b1) after treatment of 10th one | pH of liquid (b2) after treatment of 5th one | pH of liquid (b2) after treatment of 10th one | Layer thickness variability after treatment of 1st one Standard deviation σ | Layer thickness variability after treatment of 5th one Standard deviation σ | Layer thickness variability after treatment of 10th one Standard deviation σ |
| --- | --- | --- | --- | --- | --- | --- |
| Ex. 57 | No | 9.7 | 10.6 | 0.9 | 1.4 | 3.4 |
| Ex. 58 | No | 8.8 | 9.1 | 0.9 | 1.0 | 1.1 |
| Ex. 59 | No | 9.2 | 9.4 | 0.9 | 1.3 | 1.4 |
| Ex. 60 | No | 8.9 | 9.2 | 0.9 | 1.1 | 1.2 |
| CEx. 14 | Yes | 8.7 | 8.9 | 3.1 | 3.2 | 3.5 |

Ex. = Example, CEx. = Comparative Example

Examples 61-72 and Comparative Example 15

Preparation of Photo-Crosslinkable Resin Composition Solution

Photo-crosslinkable resin composition solutions were obtained by mixing components shown in Tables 15 and 16. Units of component amounts shown in Tables 15 and 16 are parts by mass. As to component (A), units of numerals in Tables 15 and 16 are parts by mass of solutions. Further, Tables 17 and 18 show contents (unit: % by mass) of components (B) and (D) based on the photo-crosslinkable resin layer.

In Tables 15 and 16, Component A is as follows.

Component (A-1); Copolymer obtained by copolymerizing methyl methacrylate/n-butyl acrylate/methacrylic acid in a mass ratio of 64/15/21 (solution of 40 mass % of the copolymer in 1-methoxy-2-propanol as a solvent).

In Tables 15 and 16, Component (B) and Component (C) are as follows.

Component (B-1); 2,2'-bis(4-methacryloxypenta-ethoxyphenyl)propane (trade name: BPE-500, supplied by SHIN-NAKAMURA CHEMICAL CO., LTD.).

Component (B-2); Trimethylolpropane triacrylate (trade name: TMP-A, supplied by KYOEISHA CHEMICAL Co. LTD.).

Component (C-1); 2-(2'-chlorophenyl)-4,5-diphenylimidazol dimer

Component (C-2); 4,4'-bis(diethylamino)benzophenone

In Tables 15 and 16, Component (D) is as follows.

Component (D-1); p-methoxyphenyl

TABLE 16

| | | Example 72 | Comparative Example 15 |
|---|---|---|---|
| Component | | DFR AA | DFR AB |
| Component A | (A-1) | 130 | 120 |
| Component B | (B-1) | 22 | 25 |
| | (B-2) | 22 | 25 |
| Component C | (C-1) | 4 | 4 |
| | (C-2) | 0.5 | 0.5 |
| Component D | (D-1) | 0.008 | 0.33 |
| Dye | Leuco crystal violet | 0.3 | 0.3 |
| | Brilliant green | 0.1 | 0.1 |
| Solvent | Methyl ethyl ketone | 30 | 30 |
| | 2-Propanol | 30 | 30 |

TABLE 15

| Example | 61 | 62 | 63 | 64 | 65 | 66 | 67 | 68 | 69 | 70 | 71 |
|---|---|---|---|---|---|---|---|---|---|---|---|
| Component | DFR A | DFR B | DFR C | DFR D | DFR E | DFR F | DFR G | DFR H | DFR I | DFR J | DFR K |
| Component A | | | | | | | | | | | |
| (A-1) | 130 | 150 | 140 | 120 | 102.5 | 130 | 130 | 130 | 130 | 155 | 97.5 |
| Component B | | | | | | | | | | | |
| (B-1) | 22 | 18 | 20 | 25 | 27.5 | 22 | 22 | 22 | 22 | 17 | 28.5 |
| (B-2) | 22 | 18 | 20 | 25 | 27.5 | 22 | 22 | 22 | 22 | 17 | 28.5 |
| Component C | | | | | | | | | | | |
| (C-1) | 4 | 4 | 4 | 4 | 4 | 4 | 4 | 4 | 4 | 4 | 4 |
| (C-2) | 0.5 | 0.5 | 0.5 | 0.5 | 0.5 | 0.5 | 0.5 | 0.5 | 0.5 | 0.5 | 0.5 |
| Component D | | | | | | | | | | | |
| (D-1) | 0.1 | 0.1 | 0.1 | 0.1 | 0.1 | 0.01 | 0.03 | 0.2 | 0.3 | 0.1 | 0.1 |
| Dye, Leuco crystal violet | 0.3 | 0.3 | 0.3 | 0.3 | 0.3 | 0.3 | 0.3 | 0.3 | 0.3 | 0.3 | 0.3 |
| Dye, Brilliant green | 0.1 | 0.1 | 0.1 | 0.1 | 0.1 | 0.1 | 0.1 | 0.1 | 0.1 | 0.1 | 0.1 |
| Solvent | | | | | | | | | | | |
| Methyl ethyl ketone | 30 | 30 | 30 | 30 | 30 | 30 | 30 | 30 | 30 | 30 | 30 |
| 2-Propanol | 30 | 30 | 30 | 30 | 30 | 30 | 30 | 30 | 30 | 30 | 30 |

TABLE 17

| Example | 61 | 62 | 63 | 64 | 65 | 66 | 67 | 68 | 69 | 70 | 71 |
|---|---|---|---|---|---|---|---|---|---|---|---|
| Component | DFR A | DFR B | DFR C | DFR D | DFR E | DFR F | DFR G | DFR H | DFR I | DFR J | DFR K |
| Component B | 44 | 36 | 40 | 49 | 54 | 44 | 44 | 44 | 43 | 34 | 56 |
| Component D | 0.10 | 0.10 | 0.10 | 0.10 | 0.10 | 0.01 | 0.03 | 0.20 | 0.30 | 0.10 | 0.10 |

TABLE 18

| | Example | |
|---|---|---|
| | Example 72 | Comparative Example 15 |
| Component | DFR AA | DFR AB |
| Component B | 44 | 48 |
| Component D | 0.008 | 0.32 |

TABLE 19

| | | Minimum resolution space width (μm) | | | | |
|---|---|---|---|---|---|---|
| Ex. | TAT (μm) | Photo-tool 50 μm | Photo-tool 30 μm | Photo-tool 20 μm | Photo-Tool 15 μm | Photo-tool 10 μm |
| 61 | 10 | 49.5 | 29 | 19 | 14 | 8.5 |
|    | 5  | 49.5 | 29 | 19 | 14 | 8.5 |
| 62 | 10 | 49 | 28.5 | 18.5 | 13.5 | 8 |
|    | 5  | 48.5 | 29 | 18 | 13 | 7.5 |
| 63 | 10 | 49.5 | 29 | 19 | 14 | 8.5 |
|    | 5  | 49.5 | 29 | 19 | 14 | 8 |
| 64 | 10 | 49.5 | 29 | 19 | 14 | 8.5 |
|    | 5  | 49.5 | 29 | 19 | 14 | 8.5 |
| 65 | 10 | 49.5 | 29 | 19 | 14 | 8.5 |
|    | 5  | 49.5 | 29 | 19 | 14 | 8.5 |
| 66 | 10 | 49 | 28.5 | 18.5 | 13.5 | 8 |
|    | 5  | 48.5 | 28 | 17.5 | 12.5 | 7 |
| 67 | 10 | 49.5 | 29 | 19 | 14 | 8.5 |
|    | 5  | 49 | 28.5 | 18.5 | 13.5 | 8 |
| 68 | 10 | 49.5 | 29 | 19 | 14 | 8.5 |
|    | 5  | 49.5 | 29 | 19 | 14 | 8.5 |
| 69 | 10 | 49.5 | 29 | 19 | 14 | 9 |
|    | 5  | 49.5 | 29 | 19 | 14 | 9 |
| 70 | 10 | 48.5 | 28.5 | 18 | 13 | 7.5 |
|    | 5  | 48 | 27.5 | 17 | 11.5 | 6 |
| 71 | 10 | 49.5 | 29 | 19 | 14 | 9 |
|    | 5  | 49.5 | 29 | 19 | 14 | 9 |
| 72 | 10 | 48 | 27 | 17 | 12 | 6.5 |
|    | 5  | 47 | 25.5 | 14 | 9 | 3 |

Ex. = Example, TAT = Thickness after treatment of layer to render it thinner (Preparation of Dry Film Resist)

The above photo-crosslinkable resin composition solutions were applied onto supporting films (thickness 25 μm) formed of a polyester film each and dried, and protective films (thickness 30 μm) formed of a polyethylene film each was laminated thereon to form dry film resists (DFR) A to K and AA to AB having a 25 μm thick photo-crosslinkable resin layer each.

Conductor patterns were formed in the same manner as in Example 1 except that the dry film resist (trade name: Sunfort AQ2575, thickness 25 μm, supplied by Asahi Kasei E-Materials) was replaced with the dry fill resists (DFR) A to K and AA to AB, that the photo-crosslinkable resin layers were treated with the alkali treatment liquid A shown in Table 1 to render them thinner such that the treated photo-crosslinkable resin layers had an average thickness of 10 μm and an average thickness of 5 μm, and that the subsequent exposure for a circuit pattern used exposure masks having drawn patterns of line/space=10/10, 15/15, 20/20, 30/30 and 50/50.

The thus-obtained etching resist layers were measured for minimum resolution space widths with an optical microscope. When the bottom portion of a resist layer had a residue, a value obtained by deducting the residue at the bottom region was taken as a minimum resolution space width. Table 19 shows the measurement results of the minimum resolution space widths. In Examples 61 to 71, the occurrence of semi-crosslinked regions of non-exposed portions caused by the halation of the substrate surfaces were effectively suppressed, and in the ultra-thin layers of the thickness-decreased photo-crosslinkable resin layers having a thickness of 10 μm or less, the residue at the bottom portion of the resist layer was suppressed, and the resist resolving of a narrow space width was permitted. In Examples 61 to 69 in which the content of the component (B) based on the photo-crosslinkable resin layer was 35 to 55 mass, the bottom residue was suppressed as compared with Example 70 in which the above content was 34 mass %. In Example 71 in which the content of the component (B) was 56 mass %, it was found that the photo-crosslinkable resin layer that had been treated to render it thinner had slight tacking nature to the exposure mask in the exposure step. In the line/space conductor patterns obtained after the etching treatment of the etching resist layers having resolved narrow space widths, there were found no defects of a broken line or short circuit that would be a problem in practical use.

In Example 72, the amount of the polymerization inhibitor was too small, so that a semi-crosslinked region of a non-exposed portion was clearly greatly generated due to halation, and a large amount of residue occurred in the bottom portion of the resist layer. Further, in Example 72, short circuits and broken lines occurred in a plurality of places in the conductor patterns of 30/30 μm or smaller other than the pattern of line/space=50/50 μm. In Comparative Example 15, the amount of the polymerization inhibitor in the dry film resist AB was too large, and the sensitivity was hence decreased, so that the resist was not crosslinked in the exposure step. That is, the dry film resist AB had no property of being photo-crosslinked. Therefore, the dry film resist was separated from the substrate in the developing treatment, and no etching resist layer could be formed.

Example 73

Step (a')

In a glass substrate epoxy resin copper-clad laminate, 100 through holes having a diameter of 200 μm and 100 through holes having a diameter of 500 μm were made with a drill, and a plated copper layer having a thickness of 10 μm was formed inside the through holes and on the copper foil, to obtain a copper-clad laminate having holes. A dry film resist (trade name: Sunfort AQ2575, thickness 25 μm, supplied by Asahi Kasei E-Materials) was laminated on the copper-clad laminate.

Step (i)

Before the photo-crosslinkable resin layer was treated to render it thinner, intimate contact exposure for the holes was carried out with a vacuum intimate contact exposure apparatus having, as a light source, an ultra-high pressure mercury lamp (trade name: URM-300, supplied by Ushio Lighting Inc.) having an output of 3 kw through an exposure mask having drawn patterns only on the through holes and their surrounding portions (circular patterns having a diameter of 400 μm each for the through holes having a diameter of 200 μm and circular patterns having a diameter of 800 μm each for the through holes having a diameter of 500 μm).

Step (b')

The photo-crosslinkable resin layer on the through holes and their surrounding portions was cured, then, the supporting film was peeled off, and the photo-crosslinkable resin layer was treated with the alkali treatment liquid A shown in Table 1 to render it thinner such that the non-cured photo-crosslinkable resin layer on the through holes and their surrounding portions had an average thickness of 10 μm, followed by full washing with water and drying with cold air, whereby a thickness-decreased photo-crosslinkable resin layer was obtained.

After the treatment to render the photo-crosslinkable resin layer thinner, a conductor pattern was formed by carrying out the steps (c), (d) and (e) in the same manner as in Example 1. When the photo-crosslinkable resin layer tented on the through hole was observed before the etching resist layer was separated, all of the 100 holes were free of breaking and separation of the photo-crosslinkable resin layer, and after the etching resist layer was separated, no corrosion was found on metal layer inside the holes. In the thus-obtained conductor pattern, further, there was found no defect of a broken line or short circuit that would be a problem in practical use.

Comparative Example 16

A conductor pattern was formed in the same manner as in Example 73 except that the treatment of the photo-crosslinkable resin layer to render it thinner was not carried out. The thus-obtained conductor pattern was observed through an optical microscope. As a result, no corrosion was found in metal layer inside the holes, while a defect of a broken line or short circuit occurred in a line/space=20 μm/20 μm pattern.

Comparative Example 17

A conductor pattern was formed in the same manner as in Example 73 except that the photo-crosslinkable resin layer on the through holes and their surrounding portions was not exposed before the treatment to render it thinner. The thus-obtained conductor pattern was observed through an optical electrode. As a result, no defect of a broken line or short circuit occurred in the line/space=20 μm/20 μm pattern, and a good fine pattern was formed. When the dry film resist on the holes was observed before the etching resist layer was separated, however, the dry film resist on all of the holes having a diameter of 500 μm each had a tenting breakage. In the holes having a diameter of 200 μm, tenting breakages occurred in 50 places or more. Further, when the insides of the holes were observed after the etching resist layer was separated, it was found that metal layer inside the holes was corroded.

Examples 74-81

Conductor patterns were formed in the same manner as in Example 1 except that the dry resist fill C was used in place of the dry film resist (trade name: Sunfort AQ2575, thickness 25 μm, supplied by Asahi Kasei E-Materials), that the dry film resist C was treated with the alkali treatment liquid A shown in Table 1 to render it thinner such that the resultant photo-crosslinkable resin layer had an average thickness of 10 μm, that a polyethylene terephthalate film was stacked thereon in the following step (f), that intimate contact exposure was carried out through an exposure mask having draw patterns of line/space=15/15, 20/20, 30/30, 50/50 and 70/70 μm in the consequent exposure for a circuit pattern, and that development was carried out after the stacked polyethylene terephthalate film was removed.

Step (f)

Polyethylene terephthalate films A to H having physical property values (thickness and haze value) shown in Table 20 were laminated on the photo-crosslinkable resin layers that had been treated to render it thinner so as to have an average thickness of 10 μm, at a roll temperature of 80° C., at an air supply pressure of 0.30 MPa and a laminating speed of 0.50 m/minute. After the polyethylene terephthalate films were laminated, there was found no inclusion of air or foreign matter between the photo-crosslinkable resin layer and the film in each case.

TABLE 20

| Ex. | Transparent film | thickness (μm) | Haze value (%) |
|---|---|---|---|
| 74 | Polyethylene terephthalate film A | 10 | 0.05 |
| 75 | Polyethylene terephthalate film B | 12 | 0.5 |
| 76 | Polyethylene terephthalate film C | 12 | 1.0 |
| 77 | Polyethylene terephthalate film D | 12 | 4.3 |
| 78 | Polyethylene terephthalate film E | 12 | 9.0 |
| 79 | Polyethylene terephthalate film F | 12 | 12.5 |
| 80 | Polyethylene terephthalate film G | 16 | 1.1 |
| 81 | Polyethylene terephthalate film H | 25 | 1.5 |

Ex. = Example

After their developments, the etching resist layers were evaluated for defects such as a narrowed line, a broken line, a thickened line, a short circuit, etc., by optical microscope observation. The ratings of the evaluation are as follows. Table 21 shows the evaluation results. In the thus-obtained conductor patterns, there was found no defect of a broken line or short circuit that would be a problem in practical use, nor was there found the defect of a broken line caused by a failure in the intimate contact of an etching resist layer.

AA: Being free of a narrowed line, a broken line, a thickened line and a short circuit.

B: A narrowed line or thickened line was found, but it was not a problem in practical use.

x: A defect of a broken line or short-circuit was found, and it was a problem in practical use.

TABLE 21

| Ex. | Resist pattern Line/space (μm) | | | | |
|---|---|---|---|---|---|
| | 15/15 | 20/20 | 30/30 | 50/50 | 70/70 |
| 74 | AA | AA | AA | AA | AA |
| 75 | AA | AA | AA | AA | AA |
| 76 | AA | AA | AA | AA | AA |
| 77 | B | AA | AA | AA | AA |
| 78 | B | B | AA | AA | AA |
| 79 | B | B | B | AA | AA |
| 80 | AA | AA | AA | AA | AA |
| 81 | AA | AA | AA | AA | AA |
| 82 | x | x | B | AA | AA |
| 83 | x | x | x | B | AA |

Ex. = Example

Example 82

A conductor pattern was formed in the same manner as in Example 74 except that the photo-crosslinkable resin layer that had been treated to render it thinner was subjected to intimate contact exposure in a state where the photo-crosslinkable resin layer was exposed. As a result, in the pattern of line/space=20/20 μm or less, there was found a defect of a thickened line of the etching resist layer or short circuit, which defect was caused by a leak of light due to a failure in vacuum intimate contact or a foreign matter or a scratch. After the etching step, the defect of a short circuit occurred all over the thus-obtained conductor pattern. Table 21 shows the evaluation results.

Example 83

A conductor pattern was formed in the same manner as in Example 74 except that intimate contact exposure was carried out in a state where the polyethylene terephthalate film A was not laminated but was placed on the photo-crosslinkable resin layer that had been treated to render it thinner. Gaps were formed between the photo-crosslinkable resin layer and the polyethylene terephthalate film, so that air was included therein, and a number of air bubbles were found. After the intimate contact exposure and developing treatment, in the pattern of line/space=30/30 μm or less, there was found a defect of a thickened line of the etching resist layer or short circuit, which defect was caused by a leak of light due to the inclusion of air bubbles. After the etching treatment, a number of defects of a short circuit that would be a problem in practical use occurred all over the thus-obtained conductor pattern. Table 21 shows the evaluation results.

INDUSTRIAL UTILITY this invention is widely used for forming fine conductor patterns by a subtractive method, and it can be also applied to a method for forming lead frames in addition to printed wiring boards explained in Examples.

The invention claimed is:

1. A method for forming a conductor pattern by a subtractive method, which consists essentially of the steps of
    (a) forming a photo-crosslinkable resin layer having a thickness of 15 to 100 μm on a substrate provided with a conductive layer on its surface by using a negative type dry film resist,
    (b) treating the photo-crosslinkable resin layer with an alkali aqueous solution to render it thinner to adjust the thickness of the photo-crosslinkable resin layer to 0.05 to 0.9 times the thickness it had before the treatment,
    (c) carrying out exposure for a circuit pattern,
    (d) developing, and
    (e) etching, the steps included in this order,
    wherein the alkali aqueous solution is an aqueous solution containing 5 to 20 mass % of an inorganic alkaline compound, and the inorganic alkaline compound is at least one compound selected from alkali metal carbonate, alkali metal phosphate, alkali metal silicate and alkali metal sulfite.

2. The method for forming a conductor pattern as recited in claim 1, wherein the inorganic alkaline compound is at least one compound selected from alkali metal carbonate, alkali metal phosphate, and alkali metal silicate.

3. The method for forming a conductor pattern as recited in claim 2, wherein the alkali aqueous solution further contains at least one selected from sulfate and sulfite.

4. The method for forming a conductor pattern as recited in claim 1, wherein the alkali aqueous solution further contains at least one selected from sulfate and sulfite.

5. The method for forming a conductor pattern as recited in claim 1, wherein the step of treating the photo-crosslinkable resin layer to render it thinner comprises the steps of (b1) carrying out the treatment with an alkali aqueous solution containing 5 to 20 mass % of at least one inorganic alkaline compound selected from alkali metal carbonate, alkali metal phosphate, and alkali metal silicate and further containing at least one selected from sulfate and sulfite, and (b2) carrying out the treatment with an aqueous solution containing at least one inorganic alkaline compound selected from alkali metal carbonate, alkali metal phosphate and alkali metal silicate and having a pH of 5 to 10.

6. The method for forming a conductor pattern as recited in claim 5, wherein the aqueous solution containing at least one inorganic alkaline compound selected from alkali metal carbonate, alkali metal phosphate and alkali metal silicate and having a pH of 5 to 10 in (b2) is supplied at a flow rate of 0.030 to 1.0 L/minute per $cm^2$ of the photo-crosslinkable resin layer and the aqueous solution is supplied by a spray method.

7. The method for forming a conductor pattern as recited in claim 1, wherein the photo-crosslinkable resin layer contains (A) a polymer containing a carboxyl group, (B) a photopolymerizable compound having at least one polymerizable ethylenically unsaturated group in a molecule, (C) a photopolymerization initiator and (D) a polymerization inhibitor, and the content of the component (D) based on the photo-crosslinkable resin layer is 0.01 to 0.3 mass %.

8. The method for forming a conductor pattern as recited in claim 7, wherein the content of the component (B) based on the photo-crosslinkable resin layer is 35 to 55 mass %.

9. The method for forming a conductor pattern as recited in claim 1, wherein a step of (f) stacking a transparent film on the photo-crosslinkable resin layer by a pressing method is intervened between the step (b) and the step (c), and a step of (g) peeling off the transparent film is intervened between the step (c) and the step (d).

10. A method for forming a conductor pattern by a subtractive method, which consists essentially of the steps of
    (a') forming a photo-crosslinkable resin layer having a thickness of 15 to 100 μm on a substrate provided with a conductive layer on its surface and inside a hole thereof by using a negative type dry film resist,
    (i) curing the photo-crosslinkable resin layer on the hole alone or on the hole and a surrounding area thereof,
    (b') treating the photo-crosslinkable resin layer in an uncured portion with an alkali aqueous solution to render it thinner to adjust the thickness of the photo-crosslinkable resin layer in the uncured portion to 0.05 to 0.9 times the thickness it had before the treatment, (c) carrying out exposure for a circuit pattern, (d) developing, and (e) etching, the steps included in this order, wherein the alkali aqueous solution is an aqueous solution containing 5 to 20 mass % of an inorganic alkaline compound, and the inorganic alkaline compound is at least one compound selected from alkali metal carbonate, alkali metal phosphate, alkali metal silicate and alkali metal sulfite.

11. The method for forming a conductor pattern as recited in claim 10, wherein a step of (f) stacking a transparent film on the photo-crosslinkable resin layer by a pressing method is intervened between the step (b') and the step (c), and a step of (g) peeling off the transparent film is intervened between the step (c) and the step (d).

12. The method for forming a conductor pattern as recited in claim 10, wherein the inorganic alkaline compound is at least one compound selected from alkali metal carbonate, alkali metal phosphate, and alkali metal silicate.

13. The method for forming a conductor pattern as recited in claim 12, wherein the alkali aqueous solution further contains at least one selected from sulfate and sulfite.

14. The method for forming a conductor pattern as recited in claim 10, wherein the alkali aqueous solution further contains at least one selected from sulfate and sulfite.

15. The method for forming a conductor pattern as recited in claim 10, wherein the step of treating the photo-crosslinkable resin layer to render it thinner comprises the steps of (b1) carrying out the treatment with an alkali aqueous solution containing 5 to 20 mass % of at least one inorganic alkaline compound selected from alkali metal carbonate, alkali metal phosphate, and alkali metal silicate and further containing at least one selected from sulfate and sulfite, and (b2) carrying out the treatment with an aqueous solution containing at least one inorganic alkaline compound selected from alkali metal carbonate, alkali metal phosphate and alkali metal silicate and having a pH of 5 to 10.

16. The method for forming a conductor pattern as recited in claim 15, wherein the aqueous solution containing at least one inorganic alkaline compound selected from alkali metal carbonate, alkali metal phosphate and alkali metal silicate and having a pH of 5 to 10 in (b2) is supplied at a flow rate of 0.030 to 1.0 L/minute per $cm^2$ of the photo-crosslinkable resin layer and the aqueous solution is supplied by a spray method.

17. The method for forming a conductor pattern as recited in claim 10, wherein the photo-crosslinkable resin layer contains (A) a polymer containing a carboxyl group, (B) a photopolymerizable compound having at least one polymerizable ethylenically unsaturated group in a molecule, (C) a photopolymerization initiator and (D) a polymerization inhibitor, and the content of the component (D) based on the photo-crosslinkable resin layer is 0.01 to 0.3 mass %.

18. The method for forming a conductor pattern as recited in claim 17, wherein the content of the component (B) based on the photo-crosslinkable resin layer is 35 to 55 mass %.

\* \* \* \* \*